(12) United States Patent
Bunch et al.

(10) Patent No.: US 7,750,685 B1
(45) Date of Patent: Jul. 6, 2010

(54) FREQUENCY MEASUREMENT BASED FREQUENCY LOCKED LOOP SYNTHESIZER

(75) Inventors: Ryan Bunch, Greensboro, NC (US); Stephen T. Janesch, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 104 days.

(21) Appl. No.: 12/251,757

(22) Filed: Oct. 15, 2008

Related U.S. Application Data

(63) Continuation-in-part of application No. 11/854,917, filed on Sep. 13, 2007, which is a continuation-in-part of application No. 11/082,277, filed on Mar. 17, 2005, now Pat. No. 7,279,988.

(60) Provisional application No. 60/825,479, filed on Sep. 13, 2006.

(51) Int. Cl.
*H03K 9/06* (2006.01)
*H03D 3/00* (2006.01)

(52) U.S. Cl. .............................. 327/48; 327/23; 327/47; 331/11; 331/25; 331/1 A

(58) Field of Classification Search .................. 331/12, 331/25, 1 A; 327/22, 27
See application file for complete search history.

(56) References Cited

U.S. PATENT DOCUMENTS

| 5,631,592 | A | * | 5/1997 | Schwarz et al. | ............. | 327/172 |
| 6,016,080 | A | * | 1/2000 | Zuta et al. | ...................... | 331/25 |
| 6,326,961 | B1 | * | 12/2001 | Lin et al. | ..................... | 345/213 |
| 2008/0231375 | A1 | * | 9/2008 | Welz et al. | ..................... | 331/17 |

* cited by examiner

*Primary Examiner*—Joseph Chang
(74) *Attorney, Agent, or Firm*—Withrow & Terranova, PLLC

(57) ABSTRACT

A first embodiment of the present invention relates to a frequency and phase locked loop (FPLL) synthesizer having a frequency-locked loop (FLL) operating mode and a phase-locked loop (PLL) operating mode. The FLL operating mode is used for rapid coarse tuning of the FPLL synthesizer and is followed by the PLL operating mode for fine tuning and stabilization of the frequency of an output signal from the FPLL synthesizer. A second embodiment of the present invention relates to a high resolution frequency measurement circuit that is capable of directly measuring the frequency of a high frequency signal to provide a high resolution frequency measurement using a lower frequency reference signal, and may include linear feedback shift register (LFSR) circuitry and LFSR-to-binary conversion circuitry. A third embodiment of the present invention relates to an FPLL having an FLL that includes the high resolution frequency measurement circuit.

29 Claims, 24 Drawing Sheets

FREQUENCY MEASUREMENT BASED FREQUENCY LOCKED LOOP SYNTHESIZER

This application is a Continuation-in-Part of U.S. utility application Ser. No. 11/854,917 entitled FREQUENCY AND PHASE LOCKED LOOP SYNTHESIZER, filed Sep. 13, 2007, currently pending, which claims the priority of provisional application 60/825,479 filed Sep. 13, 2006. U.S. utility application Ser. No. 11/854,917 is also a Continuation-in-Part of U.S. utility application Ser. No. 11/082,277 entitled DIGITAL FREQUENCY LOCKED LOOP AND PHASE LOCKED LOOP FREQUENCY SYNTHESIZER, filed Mar. 17, 2005, which issued as U.S. Pat. No. 7,279,988 on Oct. 9, 2007. The disclosures of all the above-identified applications are incorporated herein by reference in their entireties.

FIELD OF THE INVENTION

The present invention relates to frequency measurement circuits and frequency synthesizers in general and in particular to frequency-locked and phase-locked loop synthesizers, which may be used in radio frequency (RF) circuitry.

BACKGROUND OF THE INVENTION

Conventional frequency synthesizers generally include a phase-locked loop (PLL). A PLL is a device that generates an output frequency that is a function of a reference frequency. When implemented in a device such as a wireless transceiver, the output frequency of the PLL may change frequently. For example, the output frequency of the PLL changes at start-up and when changing channels. In each of these situations, it is desirable for the PLL to settle as quickly as possible on a desired output frequency. Further, in frequency hopping spread spectrum (FHSS) transceivers, the output frequency of the PLL changes for each frequency hop. Thus, the PLL is required to have an even faster settling time in order to comply with the timing requirements of the frequency hopping transceiver. One PLL system starts with a coarse tuning mode for rapid frequency tuning before switching to a fine tuning mode for stabilization and final settling. A controllable oscillator in the PLL system may use a tunable element with discrete steps, such as a selectable capacitor bank, for coarse tuning, and may use a continuously tunable element, such as one or more varactor diodes, for fine tuning.

In conventional PLLs there is a trade-off between settling time and phase noise, which are both a function of the gain, and the pole and zero locations in the PLL, which is well known to those skilled in the art of PLL design. The use of coarse tuning systems further adds to the start-up or settle time of the oscillator. Thus, a designer may be forced to select a bandwidth for the loop that meets the phase noise requirements while providing a less than desirable settling time, and vice versa. However, a coarse tuning system that provides high tuning resolution can help mitigate the trade-off between phase noise requirements and settling time. Thus, there remains a need for a frequency synthesizer that minimizes the trade-off between settling time and phase noise, and that has a reduced settling time.

SUMMARY OF THE INVENTION

A first embodiment of the present invention relates to a frequency and phase locked loop (FPLL) synthesizer having a frequency-locked loop (FLL) with an FLL operating mode and a phase-locked loop (PLL) with a PLL operating mode. The FLL operating mode is used for rapid coarse tuning of the FPLL synthesizer and is followed by the PLL operating mode for fine tuning and stabilization of the frequency of an output signal from the FPLL synthesizer. The FPLL synthesizer includes a variable frequency oscillator having a coarse tuning control input and a fine tuning control input. The coarse tuning control input is controlled by FLL circuitry, and the fine tuning input is controlled by PLL circuitry. The use of a frequency-locked loop allows faster settling time for the coarse tuning value than prior art linear and binary search methods. The FLL operating mode may be sub-divided into an FLL acquisition mode for rapid frequency tuning, and an FLL average and interpolate mode to complete frequency tuning before switching to the PLL operating mode.

In a second embodiment of the present invention, the FPLL synthesizer may include frequency reduction circuitry for reducing the frequency of the output signal for use in the FLL and PLL circuitry. The FLL circuitry may include frequency detection circuitry for measuring the frequency error of the frequency reduced output signal, and a loop filter to control the bandwidth of an FLL control loop formed by the FLL circuitry and the variable frequency oscillator. The PLL circuitry may include phase detection circuitry for measuring the phase error of the frequency reduced output signal and a loop filter to control the bandwidth of a PLL control loop formed by the PLL circuitry and the variable frequency oscillator. Since the frequency reduction circuitry within the FLL circuitry reduces the frequency of the output signal, the gain and resolution of the FLL control loop may also be reduced, as in the case of using a frequency divider; therefore, the FLL control loop may include gain elements, such as analog gain elements, digital gain elements, or both, to recover some of the gain. To reduce tuning times, the gain of the FLL control loop may be higher during the FLL acquisition mode than during the FLL average and interpolate mode.

In one embodiment of the present invention, the FPLL synthesizer is a translational loop FPLL synthesizer, which may also be called an offset or dual loop FPLL that may use a local oscillator (LO) FPLL synthesizer to provide a reference signal to a primary FLL, primary PLL, or both. The LO FPLL synthesizer may have a coarse tuning mode and a fine tuning mode, and the primary FLL may begin coarse tuning before the LO FPLL synthesizer is completely settled, such as when the LO FPLL synthesizer switches from an FLL operating mode to a PLL operating mode, which may reduce frequency acquisition times when compared with binary-search algorithms, linear search algorithms, and other methods. There is a trade-off between settling time and phase noise, which are both a function of the gain, and the pole and zero locations in the FPLL synthesizer. Additionally, to reduce tuning times, a deliberate bias may be introduced into the FLL control loop to prevent the loop from getting stuck at a particular quantization level for an extended time period.

A third embodiment of the present invention relates to a high resolution frequency measurement circuit that is capable of directly measuring the frequency of a high frequency signal to provide a high resolution frequency measurement using a lower frequency reference signal. Traditional frequency measurements of high frequency signals have included frequency reduction circuitry to reduce the frequency of processed signals; however, frequency resolution may be reduced when using frequency reduction circuitry. The present invention may include linear feedback shift register (LFSR) circuitry and LFSR-to-binary conversion circuitry to provide high resolution frequency measurements.

A fourth embodiment of the present invention relates to combining the first and third embodiments of the present invention, which incorporates the high resolution frequency measurement circuit into the FLL circuitry of the FPLL circuitry, such that the high resolution frequency measurement circuit may directly receive the output of the variable frequency oscillator directly to provide high resolution, which may reduce settling times compared to FLL circuitry that uses frequency reduction.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

Figure 1:
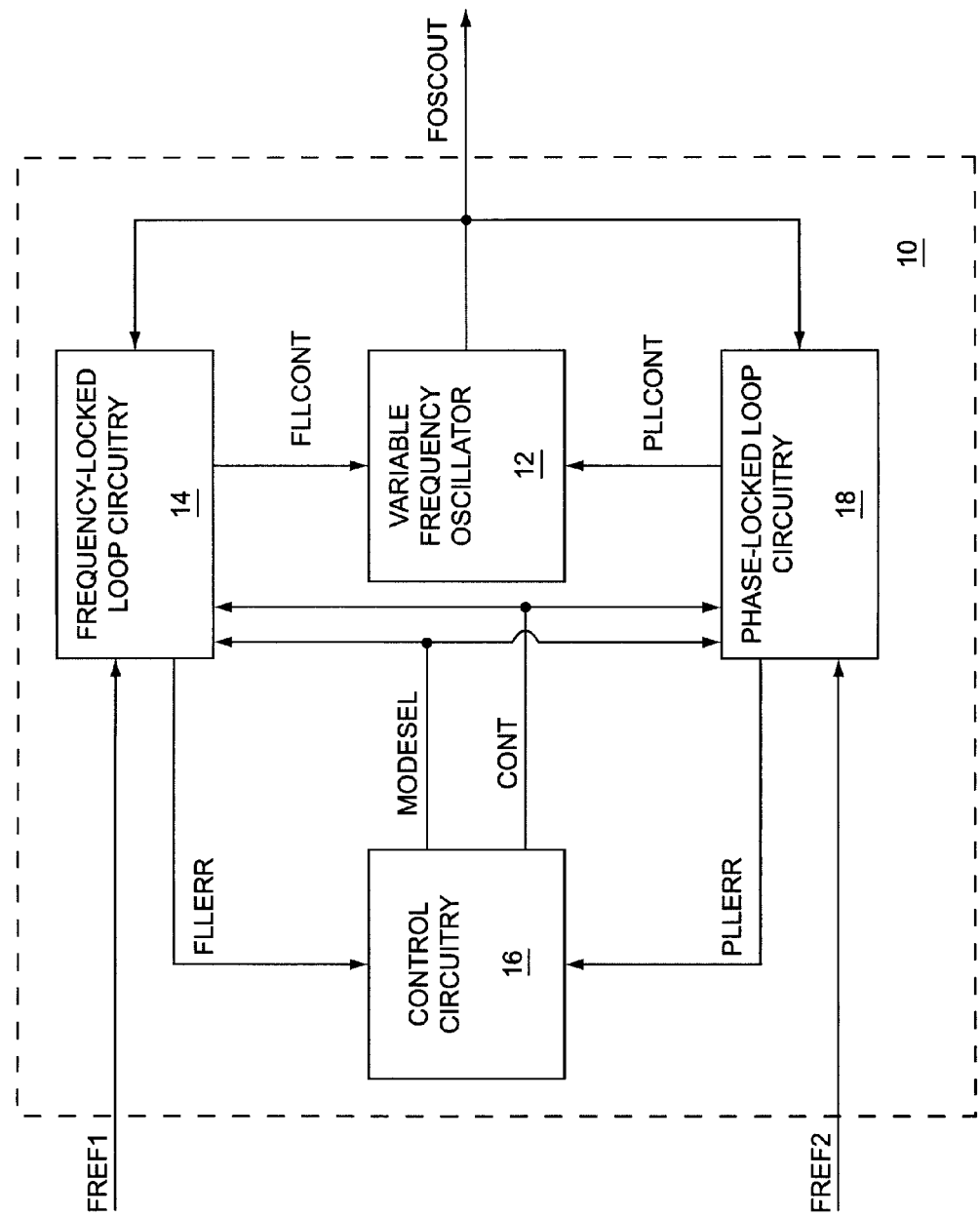
FIG. 1 shows a frequency and phase locked loop (FPLL) synthesizer, according to a first embodiment of the present invention.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

A first embodiment of the present invention relates to a frequency and phase locked loop (FPLL) synthesizer having a frequency-locked loop (FLL) with an FLL operating mode and a phase-locked loop (PLL) with a PLL operating mode. The FLL operating mode is used for rapid coarse tuning of the FPLL synthesizer and is followed by the PLL operating mode for fine tuning and stabilization of the frequency of an output signal from the FPLL synthesizer. The FPLL synthesizer includes a variable frequency oscillator having a coarse tuning control input and a fine tuning control input. The coarse tuning control input is controlled by FLL circuitry, and the fine tuning input is controlled by PLL circuitry. The use of a frequency-locked loop allows faster settling time for the coarse tuning value than prior art linear and binary search methods. The FLL operating mode may be sub-divided into an FLL acquisition mode for rapid frequency tuning, and an FLL average and interpolate mode to complete frequency tuning before switching to the PLL operating mode.

In a second embodiment of the present invention, the FPLL synthesizer may include frequency reduction circuitry for reducing the frequency of the output signal for use in the FLL and PLL circuitry. The FLL circuitry may include frequency detection circuitry for measuring the frequency error of the frequency reduced output signal, and a loop filter to control the bandwidth of an FLL control loop formed by the FLL circuitry and the variable frequency oscillator. The PLL circuitry may include phase detection circuitry for measuring the phase error of the frequency reduced output signal and a loop filter to control the bandwidth of a PLL control loop formed by the PLL circuitry and the variable frequency oscillator.

Since the frequency reduction circuitry within the FLL circuitry reduces the frequency of the output signal, the gain and resolution of the FLL control loop may also be reduced, as in the case of using a frequency divider; therefore, the FLL control loop may include gain elements, such as analog gain elements, digital gain elements, or both, to recover some of the gain. To reduce tuning times, the gain of the FLL control loop may be higher during the FLL acquisition mode than during the FLL average and interpolate mode.

In one embodiment of the present invention, the FPLL synthesizer is a translational loop FPLL synthesizer, which may also be called an offset or dual loop FPLL that may use a local oscillator (LO) FPLL synthesizer to provide a reference signal to a primary FLL, primary PLL, or both. The LO FPLL synthesizer may have a coarse tuning mode and a fine tuning mode, and the primary FLL may begin coarse tuning before the LO FPLL synthesizer is completely settled, such as when the LO FPLL synthesizer switches from an FLL operating mode to a PLL operating mode to further reduce overall settling time of the FPLL synthesizer. There is a trade-off between settling time and phase noise, which are both a function of the gain, and the pole and zero locations in the FPLL synthesizer. To reduce tuning times, a deliberate bias may be introduced into the FLL control loop to prevent the loop from getting stuck at a particular quantization level for an extended time period.

A third embodiment of the present invention relates to a high resolution frequency measurement circuit that is capable of directly measuring the frequency of a high frequency signal to provide a high resolution frequency measurement using a lower frequency reference signal. Traditional frequency measurements of high frequency signals have included frequency reduction circuitry to reduce the frequency of processed signals; however, frequency resolution may be reduced when using frequency reduction circuitry. The present invention may include linear feedback shift register (LFSR) circuitry and LFSR-to-binary conversion circuitry to provide high resolution frequency measurements.

A fourth embodiment of the present invention relates to combining the first and third embodiments of the present invention, which incorporates the high resolution frequency measurement circuit into the FLL circuitry of the FPLL circuitry, such that the high resolution frequency measurement circuit may directly receive the output of the variable frequency oscillator directly to provide high resolution, which may reduce settling times compared to FLL circuitry that uses frequency reduction.

FIG. 1 shows an FPLL synthesizer 10, according to a first embodiment of the present invention. The FPLL synthesizer 10 includes a variable frequency oscillator 12, which provides a first oscillator output signal FOSCOUT. Frequency-locked loop circuitry 14 receives the first oscillator output signal FOSCOUT and a first frequency reference signal FREF1, and provides an FLL error signal FLLERR to control circuitry 16 and an FLL control signal FLLCONT to the variable frequency oscillator 12. The FLL control signal FLLCONT is used for coarse tuning of the FPLL synthesizer 10. Both signals FLLERR, FLLCONT are based on a frequency error of the first oscillator output signal FOSCOUT relative to the first frequency reference signal FREF1.

Phase-locked loop circuitry 18 receives the first oscillator output signal FOSCOUT and a second frequency reference signal FREF2, and provides a PLL error signal PLLERR to the control circuitry 16 and a PLL control signal PLLCONT to the variable frequency oscillator 12. The PLL control signal PLLCONT is used for fine tuning the FPLL synthesizer 10. Both signals PLLERR, PLLCONT are based on a phase error of the first oscillator output signal FOSCOUT relative to the second frequency reference signal FREF2. In one embodiment of the present invention, the first and second frequency reference signals FREF1, FREF2 may be provided by a common frequency reference signal (not shown).

The control circuitry 16 provides a mode select signal MODESEL to the frequency-locked loop and phase-locked loop circuitry 14, 18. The mode select signal MODESEL selects either an FLL operating mode or a PLL operating mode. During the FLL operating mode, the frequency of the first oscillator output signal FOSCOUT is based on the FLL control signal FLLCONT and the PLL control signal PLLCONT is held constant, whereas during the PLL operating mode, the frequency of the first oscillator output signal FOSCOUT is based on the PLL control signal PLLCONT and FLL control signal FLLCONT is held constant. The control circuitry 16 may switch the mode select signal MODESEL from the FLL operating mode to the PLL operating mode based on the FLL error signal FLLERR. Alternatively, the control circuitry 16 may switch operating modes based on a time duration of the FLL operating mode. The control circuitry 16 may also provide a control signal CONT to the frequency-locked loop and phase-locked loop circuitry 14, 18 for configuration selection, control, or any needed information that is not provided by the mode select signal MODESEL, such as initial set-up of the FPLL synthesizer 10.

Generally, coarse tuning is done using the FLL operating mode, which is then switched to the PLL operating mode for fine tuning. The switch to the PLL operating mode can be made when the FLL has settled within its resolution, or when the frequency error is low enough to provide a reasonable lock time in the PLL operating mode. The switch can be triggered by a frequency error measurement in the frequency-locked loop circuitry 14 or by a simple timer, such as a counter, programmed with a value predetermined to provide adequate settle time for the FLL, or by a combination of both. Alternate embodiments of the present invention may use any combination of the FLL and PLL error signals FLLERR, PLLERR, the FLL and PLL control signals FLLCONT, PLLCONT, the first and second reference signals FREF1, FREF2, and the first oscillator output signal FOSCOUT to determine mode selection. Each of the FLL and PLL control signals FLLCONT, PLLCONT may include digital data, analog data, or both; therefore, the variable frequency oscillator 12 may include a digital controlled oscillator (DCO), a voltage controlled oscillator (VCO), a current controlled oscillator (ICO), or any combination thereof. The variable frequency oscillator 12 may also include selectable capacitor banks, varactor diodes, variable current sources, or other devices to change the frequency of the first oscillator output signal FOSCOUT. The frequency-locked loop circuitry 14, the control circuitry 16, and the phase-locked loop circuitry 18 may include analog circuitry, digital circuitry, one or more software programs executing on computer hardware, such as a microprocessor, a digital signal processor, the like, or any combination thereof.

Figure 2:
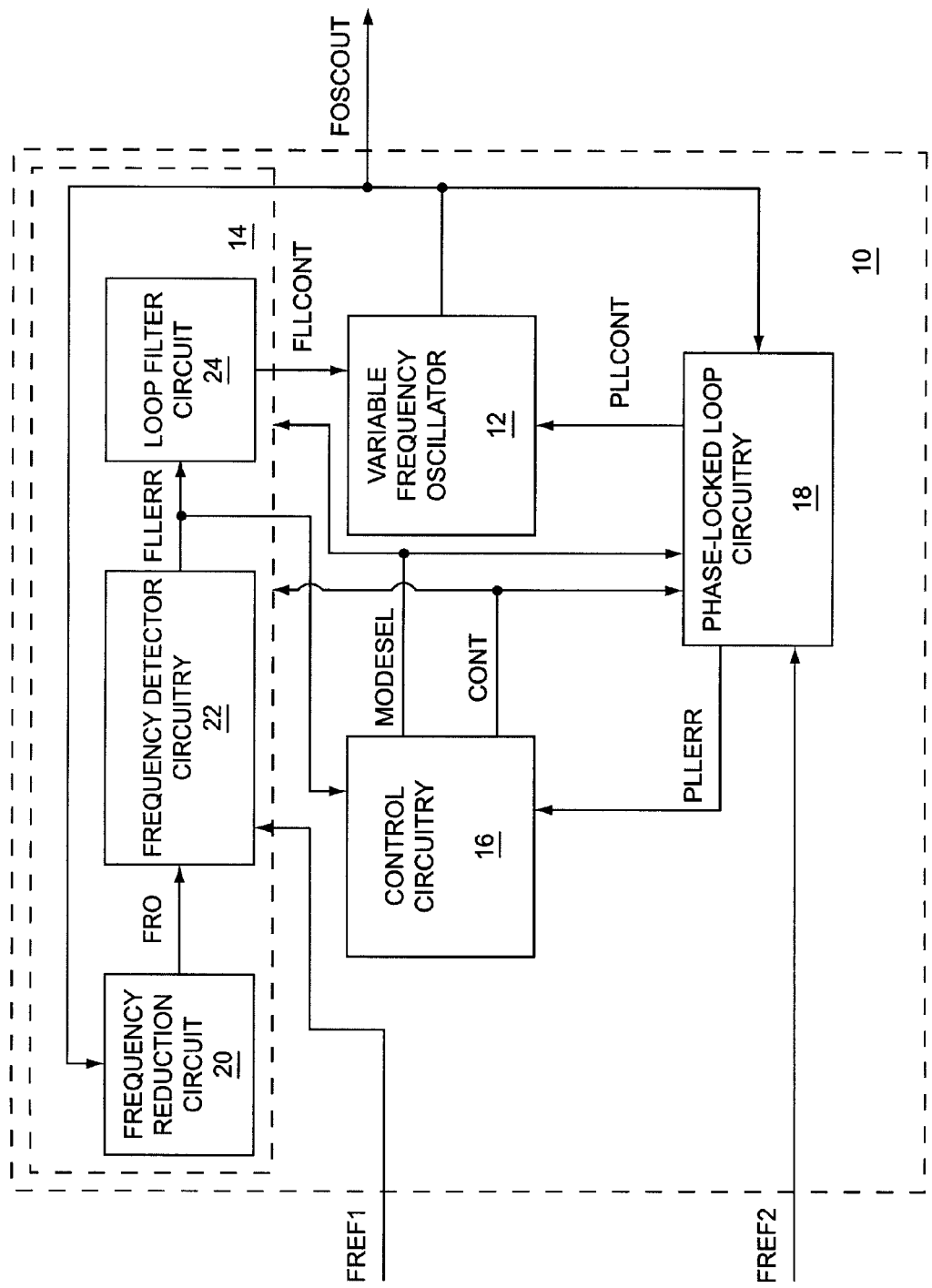
FIG. 2 shows details of the frequency-locked loop (FLL) circuitry illustrated in FIG. 1, according to a second embodiment of the present invention.

FIG. 2 shows details of the frequency-locked loop circuitry 14 illustrated in FIG. 1, according to a second embodiment of the present invention. The first oscillator output signal FOSCOUT feeds a frequency reduction circuit 20, which produces a frequency reduced output signal FRO based on the first oscillator output signal FOSCOUT, such that the frequency of the frequency reduced output signal FRO is normally less than the frequency of the first oscillator output signal FOSCOUT. Frequency detector circuitry 22 receives the frequency reduced output signal FRO and the first frequency reference signal FREF1, and provides the FLL error signal FLLERR to the control circuitry 16 and to a loop filter circuit 24. The FLL error signal FLLERR may be based on a frequency difference between the frequency reduced output signal FRO and the first frequency reference signal FREF1. The loop filter circuit 24 includes a filter, such as a lowpass filter or an integrator, and filters the FLL error signal FLLERR to provide the FLL control signal FLLCONT. Those skilled in the art will recognize that the frequency-locked loop circuitry 14 forms a negative-feedback control system, which automatically determines a value for the FLL control signal FLLCONT that minimizes the average value of the FLL error signal FLLERR. In an alternate embodiment of the present invention, the frequency reduction circuit 20 may be part of the frequency-locked loop circuitry 14, part of the phase-locked loop circuitry 18, or the frequency-locked and phase-locked loop circuitry 14, 18 may each have frequency reduction circuitry.

Figure 3:
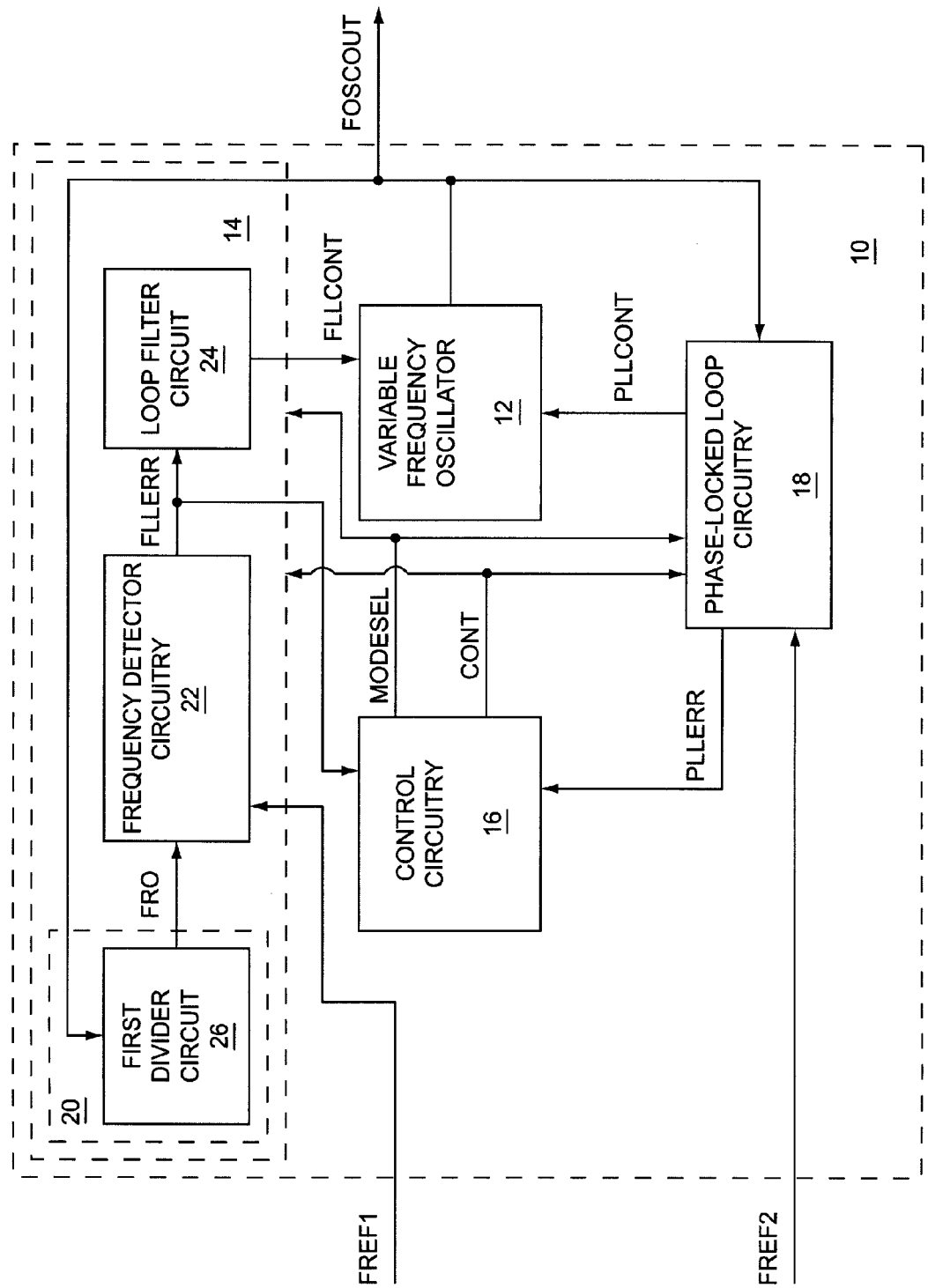
FIG. 3 shows one embodiment of the frequency reduction circuit illustrated in FIG. 2.

FIG. 3 shows one embodiment of the frequency reduction circuit 20 illustrated in FIG. 2. The frequency reduction circuit 20 may include a first divider circuit 26, such that the frequency of the first oscillator output signal FOSCOUT divided by the frequency of the frequency reduced output signal FRO is approximately equal to a first integer divided by a second integer. The use of the frequency reduction circuit 20 may be advantageous in situations where the frequency of the first oscillator output signal FOSCOUT is significantly higher than the frequency of the first frequency reference signal FREF1; however, in an alternate embodiment of the present invention, the frequency of the first oscillator output signal FOSCOUT may be lower than the frequency of the first frequency reference signal FREF1.

In an additional embodiment of the present invention, the FPLL synthesizer 10 and frequency-locked loop circuitry 14 may be implemented without the frequency reduction circuit 20. This may be advantageous in situations where the frequency of the first oscillator output signal FOSCOUT is not greatly different than the frequency of the first frequency reference signal FREF1. Examples of this situation include the use of a synthesizer to reduce jitter or to correct frequency errors in a clock signal generated from a noisy source or an inaccurately tuned source, respectively.

Figure 4:
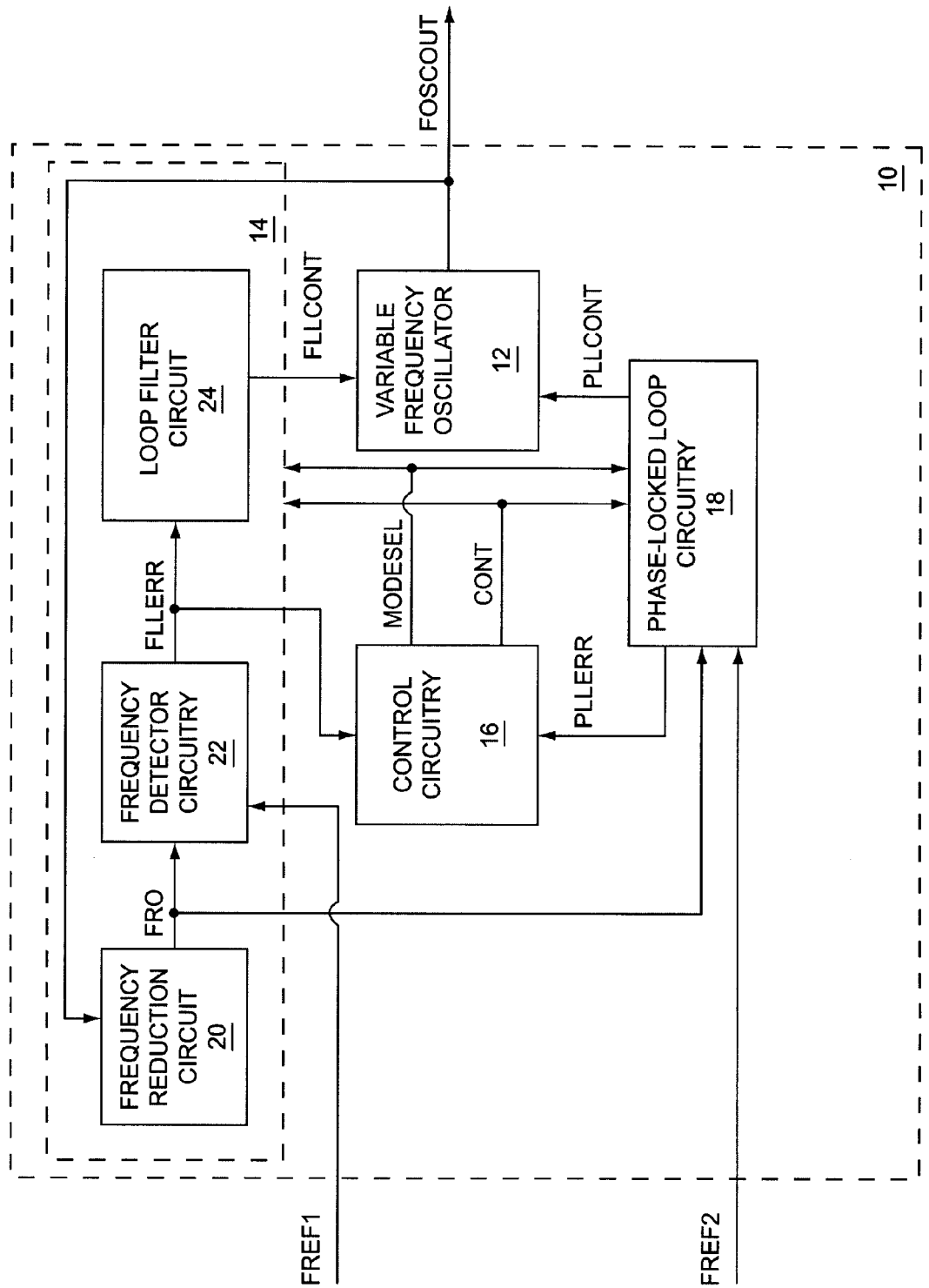
FIG. 4 shows an alternate embodiment of the FPLL synthesizer.

FIG. 4 shows an alternate embodiment of the FPLL synthesizer 10. The phase-locked loop circuitry 18 may share some of the frequency-locked loop circuitry 14, such as the frequency reduction circuit 20. The phase-locked loop circuitry 18 may receive the frequency reduced output signal FRO instead of the first oscillator output signal FOSCOUT, such that the PLL error signal PLLERR is based on a phase difference between the frequency reduced output signal FRO and the second frequency reference signal FREF2.

Figure 5:
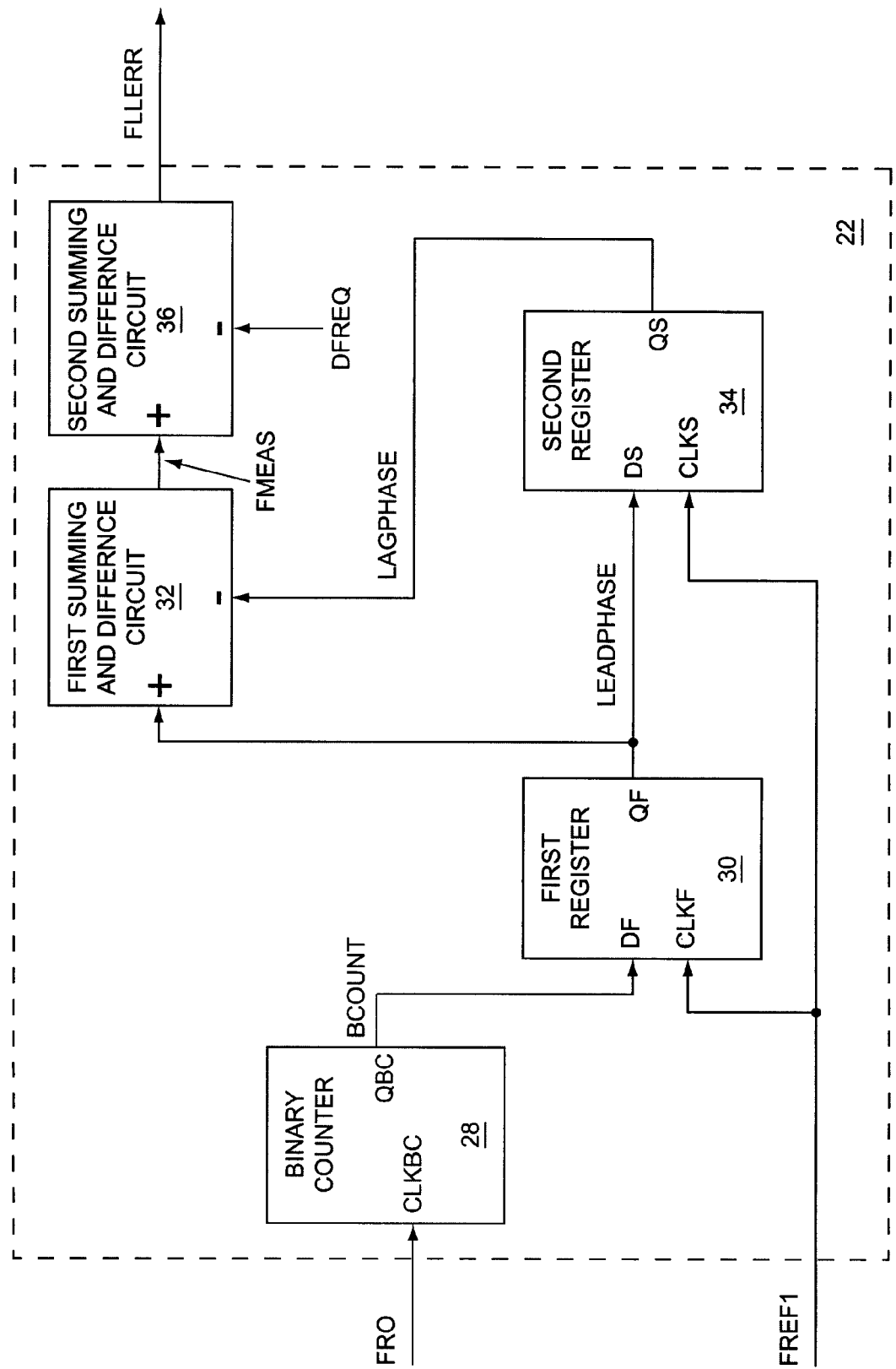
FIG. 5 shows details of the frequency detector circuitry illustrated in FIG. 2.

FIG. 5 shows details of the frequency detector circuitry 22 illustrated in FIG. 2. The frequency detector circuitry 22 provides the FLL error signal FLLERR by measuring the frequency of the frequency reduced output signal FRO and subtracting out a desired frequency, which is provided by a desired frequency value DFREQ. The frequency may be measured by counting the number of cycles of the frequency reduced output signal FRO that occur during a specified time period, which may be at least one period of the first frequency reference signal FREF1. In one embodiment of the present invention, the desired frequency may be approximately equal to the frequency of the first frequency reference signal FREF1, such that the desired frequency value DFREQ, representing the number of cycles of the frequency reduced output signal FRO that occur during one period of the first frequency reference signal FREF1, is approximately one. In an alternate embodiment of the frequency detector circuitry 22, the frequency may be measured by counting the number of cycles of the first oscillator output signal FOSCOUT that occur during a specified time period, which may be at least one period of the first frequency reference signal FREF1. In an additional embodiment of the present invention, the frequency detector circuitry 22 provides only a fixed positive or fixed negative value for the FLL error signal FLLERR if the frequency reduced output signal FRO has a shorter or longer period than the first frequency reference signal FREF1, respectively, thereby providing a "bang-bang" type of control algorithm for the FLL. In an exemplary embodiment of the present invention, the value of the FLL error signal FLLERR is approximately proportional to the frequency error measured by the frequency detector circuitry 22 giving a better behaved proportional, proportional-integral, or proportional-integral-differential control algorithm for the FLL, depending on the implementation of the loop filter circuit 24.

The frequency detector circuitry 22 includes a binary counter 28 having a binary counter clock input CLKBC, which receives the frequency reduced output signal FRO, and a binary counter data output QBC, which provides a binary count output signal BCOUNT. Each cycle of the frequency reduced output signal FRO may increment the binary counter 28. The value of the binary counter 28 is provided from the binary counter data output QBC, which may include multiple data bits. The binary count output signal BCOUNT feeds a first data input DF of a first register 30, which includes a first data output QF and a first clock input CLKF. The first frequency reference signal FREF1 feeds the first clock input CLKF. On an edge of the first frequency reference signal FREF1, the value of the binary counter 28 is clocked into the first register 30, and then appears at the first data output QF, which provides a leading count signal LEADPHASE. It will be appreciated by those skilled in the art that additional embodiments may replace the binary counter 28 with a Gray code counter or other digital sequence generating circuit with a decoding circuit to provide an equivalent measure of the elapsed count.

The leading count signal LEADPHASE feeds a first summing input + of a first summing and difference circuit 32 and a second data input DS of a second register 34, which includes a second data output QS and a second clock input CLKS. The first frequency reference signal FREF1 feeds the second clock input CLKS. On a subsequent edge of the first frequency reference signal FREF1, the value of the binary counter 28 that was previously clocked into the first register 30 is clocked into the second register 34, and then appears at the second data output QS, which provides a lagging count signal LAGPHASE. The lagging count signal LAGPHASE feeds a first difference input − of the first summing and difference circuit 32, which provides an output signal based on a difference between a signal at the first summing input + and a signal at the first difference input −.

At any time after an edge of the first frequency reference signal FREF1, such that the first and second data outputs QF, QS have had time to stabilize, the difference between the leading count signal LEADPHASE and the lagging count signal LAGPHASE is approximately equal to the number of cycles of the frequency reduced output signal FRO counted between the two edges of the first frequency reference signal FREF1. The number of cycles counted is proportional to the frequency of the frequency reduced output signal FRO; therefore, the output signal, called the measured frequency signal FMEAS, from the first summing and difference circuit 32 is proportional to the frequency of the frequency reduced output signal FRO. The measured frequency signal FMEAS feeds a second summing input + of a second summing and difference circuit 36. The desired frequency signal DFREQ feeds a second difference input − of the second summing and difference circuit 36, which provides the FLL error signal FLLERR based on a difference between the measured frequency signal FMEAS and the desired frequency signal DFREQ.

Since the frequency reduced output signal FRO is typically not synchronized with the first frequency reference signal FREF1, one or more bits in the binary count output signal BCOUNT may be changing when clocked into the first register 30; therefore, an erroneous value of the binary counter 28 may be clocked into the first register 30. If the binary counter 28 was changing from a value with multiple "1s" to a value with multiple "0s," such as 0111 to 1000, the clocked value of the binary counter 28 could be in error by multiple bits.

Figure 6:
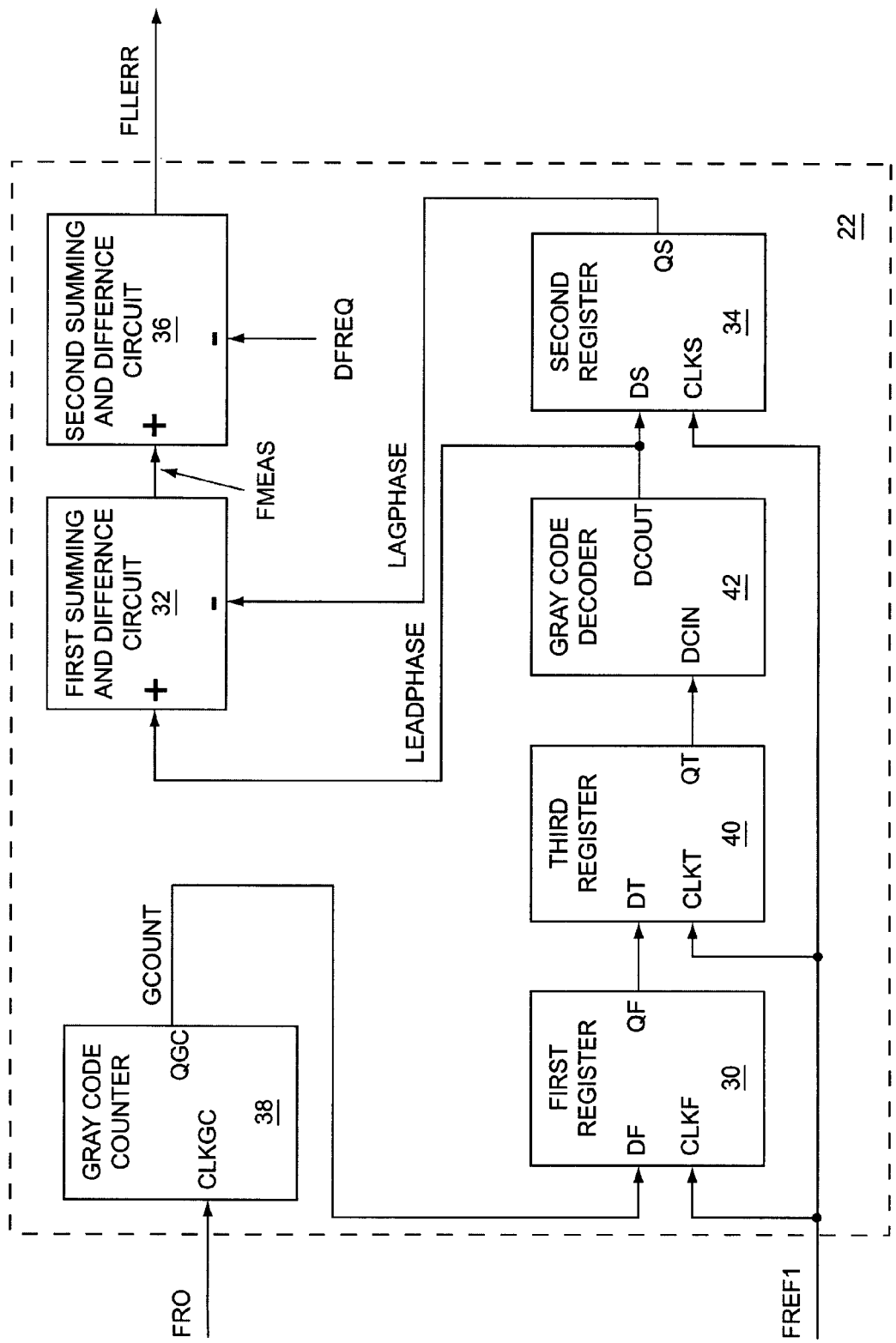
FIG. 6 shows an alternate embodiment of the frequency detector circuitry.

FIG. 6 shows an alternate embodiment of the frequency detector circuitry 22. The binary counter 28 is replaced with a Gray code counter 38, which has a Gray counter clock input CLKGC that receives the frequency reduced output signal FRO, and a Gray code counter data output QGC, which provides a Gray code count output signal GCOUNT. Each cycle of the frequency reduced output signal FRO may increment the Gray code counter 38. The value of the Gray code counter 38 is provided from the Gray code counter data output QGC, which may include multiple data bits. The Gray code counter 38 is a binary counter that provides a Gray code output, which changes only one bit for each incremental value of its binary counter; therefore, any count errors introduced due to asynchronous clocking of registers receiving the Gray code count output signal GCOUNT will result in a maximum count error of one bit. The Gray code count output signal GCOUNT feeds the first data input DF of the first register 30.

The first data output QF of the first register 30 feeds a third data input DT of a third register 40, which includes a third data output QT and a third clock input CLKT. The first frequency reference signal FREF1 feeds the third clock input CLKT. On a subsequent edge of the first frequency reference signal FREF1, the value of the Gray code counter 38 that was previously clocked into the first register 30 is clocked into the third register 40, and then appears at the third data output QT. The third data output QT of the third register 40 feeds a decoder input DCIN of a Gray code decoder 42, which converts a Gray code signal into a binary signal provided from a decoder output DCOUT, which provides the leading count signal LEADPHASE. Additional embodiments of the present invention may include fewer or more registers, coding systems other than a Gray code, at least one divider in series with the first frequency reference signal FREF1, at least one divider in series with the frequency reduced output signal FRO, different frequency measuring systems, different frequency error measuring systems, or any combination thereof. A coding system may be used other than a Gray code system that still provides a single-bit change in its output value for each clocking event.

Figure 7:
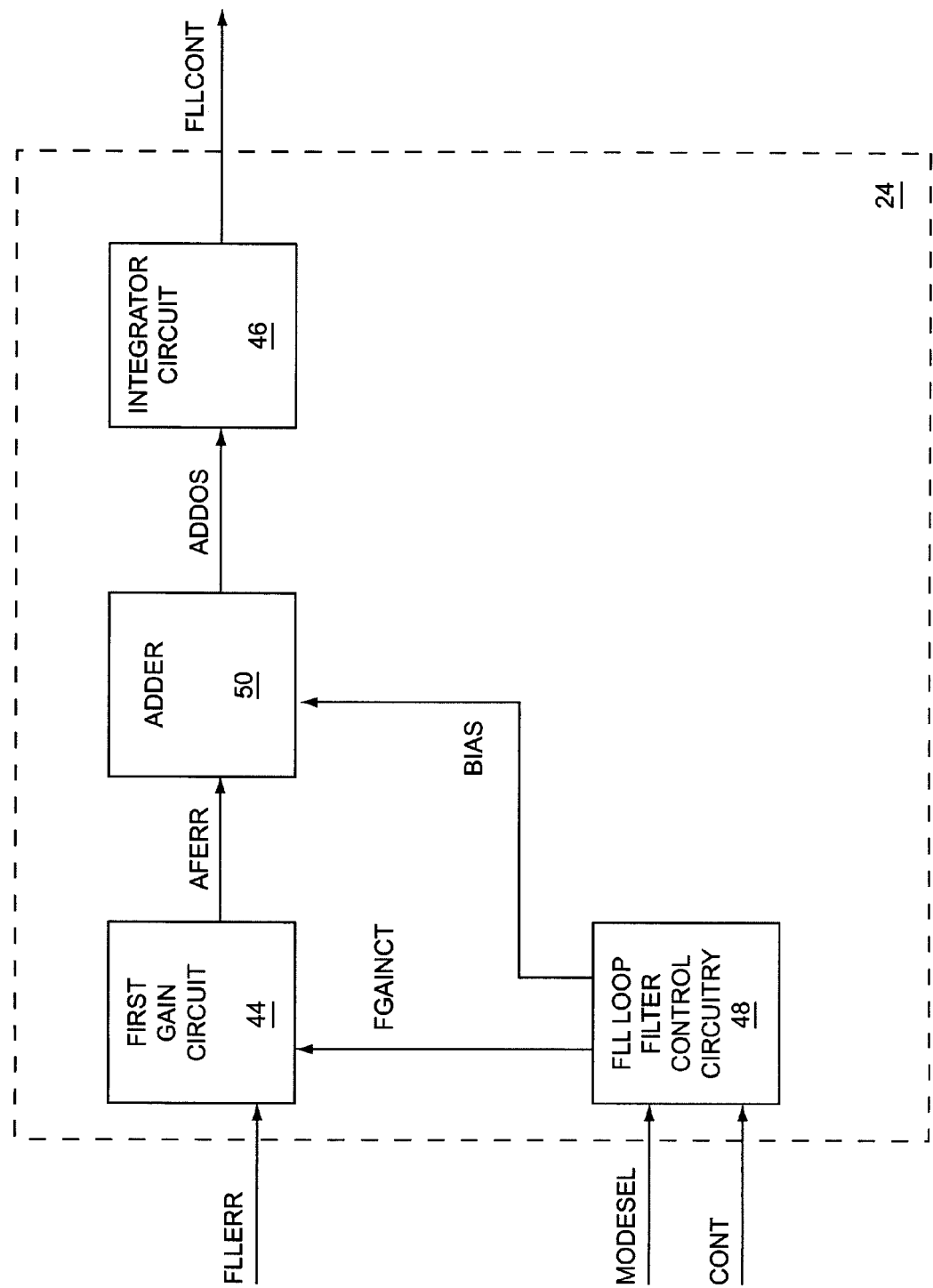
FIG. 7 shows details of the loop filter circuit illustrated in FIG. 2.

FIG. 7 shows details of the loop filter circuit 24 illustrated in FIG. 2. The loop filter circuit 24 includes a first gain circuit 44, an integrator circuit 46, FLL loop filter control circuitry 48, and an adder 50. The first gain circuit 44 receives and amplifies the FLL error signal FLLERR to provide an amplified FLL error signal AFERR to the adder 50, which may add an offset, or "push," signal based on a bias signal BIAS to create an adder output signal ADDOS. The integrator circuit 46 receives and filters the adder output signal ADDOS using integration to provide the FLL control signal FLLCONT.

In one embodiment of the present invention, the FLL loop filter control circuitry 48 receives the control signal CONT and the mode select signal MODESEL, and may provide the bias signal BIAS. Since the FLL error signal FLLERR is based on a frequency difference between the frequency reduced output signal FRO and the first frequency reference signal FREF1, as the frequency of the frequency reduced output signal FRO approaches the frequency of the first frequency reference signal FREF1, the FLL error signal FLLERR approaches zero. Therefore, due to the quantization of values in a digital implementation, the represented value of the FLL error signal FLLERR could be zero and an undesirable amount of time may have to pass before the FLL control signal FLLCONT changes significantly. The bias signal BIAS adds a "push" to an input of the integrator circuit 46 so that the FLL control signal FLLCONT keeps changing, which reduces the time needed to identify when to switch operating modes. The bias, or "push," that is added to the integrator input may be subtracted out so that the first oscillator output signal FOSCOUT is tuned to the correct frequency. Any or all of the first gain circuit 44, the integrator circuit 46, the FLL loop filter control circuitry 48, and the adder 50 may be provided by digital circuitry, one or more software programs executing on computer hardware, such as a microprocessor, a digital signal processor, both, or the like. The bias signal BIAS may cause the adder 50 to periodically add or subtract a single count to the amplified FLL error signal AFERR.

The FLL loop filter control circuitry 48 may provide a first gain control signal FGAINCT to the first gain circuit 44 to control the gain of the FLL loop, called FLL loop gain. Since reducing the frequency of the first oscillator output signal FOSCOUT reduces the gain and bandwidth of the FLL loop, recovering some of the FLL loop gain may be beneficial for certain operating modes; therefore, the FLL loop filter control circuitry 48 may increase or decrease the FLL loop gain, as needed. In one embodiment of the present invention, the FLL operating mode is sub-divided into an FLL acquisition mode for rapid frequency tuning, and an FLL average and interpolate mode to complete frequency tuning before switching to the PLL operating mode. Coarse tuning begins with the FLL acquisition mode, such that the FLL error signal FLLERR remains either positive or negative. When the FLL error signal FLLERR starts toggling between positive and negative, the FLL acquisition mode switches to the FLL average and interpolate mode. The duty-cycle of the positive, or negative, FLL error signal FLLERR is determined by the FLL loop filter control circuitry 48, then the appropriate first gain control signal FGAINCT and bias signal BIAS are created. During the FLL acquisition mode, the FLL loop gain may be increased for rapid frequency tuning.

In an exemplary embodiment of the present invention, the variable frequency oscillator 12 is a digitally controlled oscillator having a capacitor bank with 128 different selectable capacitance values; therefore, the FLL control signal FLLCONT is a digital signal having 128 different values. The frequency reduction circuit 20 includes the first divider circuit 26, which reduces the FLL loop gain such that some gain needs to be restored. For each single value change of the FLL error signal FLLERR, the amplified FLL error signal AFERR changes by eight times the single value change, which increases the FLL loop gain by a factor of eight. For example, if the FLL error signal FLLERR changes by a single increment of a binary count, then the amplified FLL error signal AFERR changes by eight increments of the binary count. In alternate embodiments, either or both of the first gain circuit 44 and the adder 50 may be omitted. Other embodiments may use other filter circuits instead of the integrator circuit 46. Regardless of the gain applied by the first gain circuit 44, the adder 50 would normally "push" by a single bit at a time.

Figure 8:
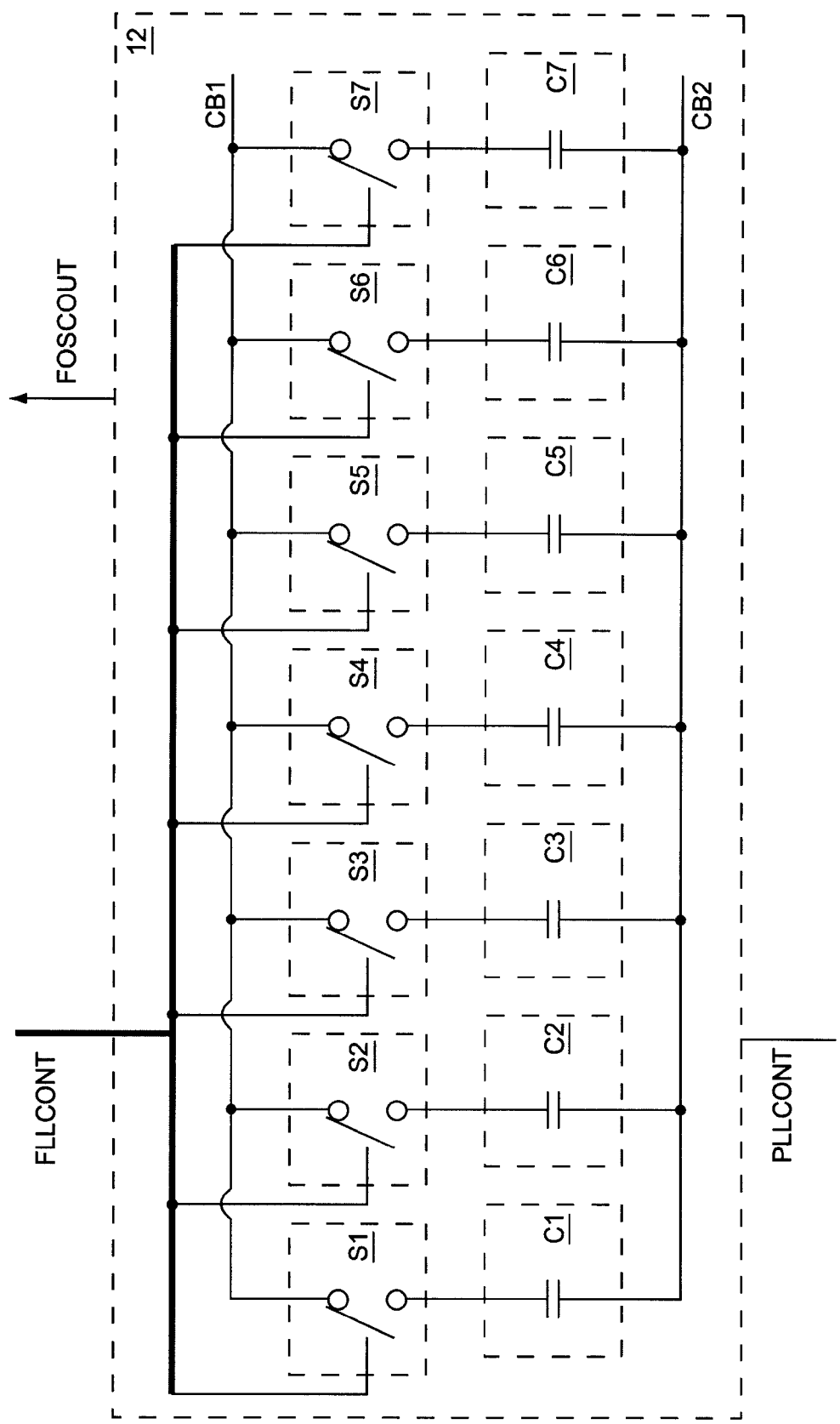
FIG. 8 shows one embodiment of the variable frequency oscillator illustrated in FIG. 1.

FIG. 8 shows one embodiment of the variable frequency oscillator 12 illustrated in FIG. 1. The variable frequency oscillator 12 may include a digitally controlled oscillator (not shown) having a capacitor bank with seven selectable capacitive elements that provide 128 different selectable capacitance values for coarse tuning; therefore, the FLL control signal FLLCONT may include a seven-bit digital signal having 128 different values. A resonant frequency of the variable frequency oscillator 12 may be based on a capacitance of the capacitor bank. The capacitor bank includes a first capacitive element C1 coupled in series with a first switching element S1. The first elements C1, S1 are coupled between a first capacitor bank node CB1 and a second capacitor bank node CB2. A first bit of the FLL control signal FLLCONT controls the first switching element S1. Similarly, a second capacitive element C2 is coupled in series with a second switching element S2, a third capacitive element C3 is coupled in series with a third switching element S3, a fourth capacitive element C4 is coupled in series with a fourth switching element S4, a fifth capacitive element C5 is coupled in series with a fifth switching element S5, a sixth capacitive element C6 is coupled in series with a sixth switching element S6, and a seventh capacitive element C7 is coupled in series with a seventh switching element S7. The series coupled elements C1, S1, C2, S2, C3, S3, C4, S4, C5, S5, C6, S6, C7, S7 are coupled between the first capacitor bank node CB1 and the second capacitor bank node CB2. Second, third, fourth, fifth, sixth, and seventh bits of the FLL control signal FLLCONT control the second, third, fourth, fifth, sixth, and seventh switching elements S2, S3, S4, S5, S6, S7, respectively.

A capacitance of the second capacitive element C2 may be approximately two times a capacitance of the first capacitive element C1. A capacitance of the third capacitive element C3 may be approximately two times a capacitance of the second capacitive element C2. A capacitance of the fourth capacitive element C4 may be approximately two times a capacitance of the third capacitive element C3. A capacitance of the fifth capacitive element C5 may be approximately two times a capacitance of the fourth capacitive element C4. A capacitance of the sixth capacitive element C6 may be approximately two times a capacitance of the fifth capacitive element C5. A capacitance of the seventh capacitive element C7 may be approximately two times a capacitance of the sixth capacitive element C6.

Alternate embodiments of the present invention may use a capacitor bank having more or fewer than seven capacitive elements, capacitive elements having a binary weighting, as described above, capacitive elements having a non-binary weighting, capacitive elements having a constant incrementing, or thermometer style, weighting, or any combination thereof. Alternate embodiments of the present invention may use discrete capacitive tuning elements, as described above, discrete non-capacitive tuning elements, or both, for coarse tuning.

Figure 9:
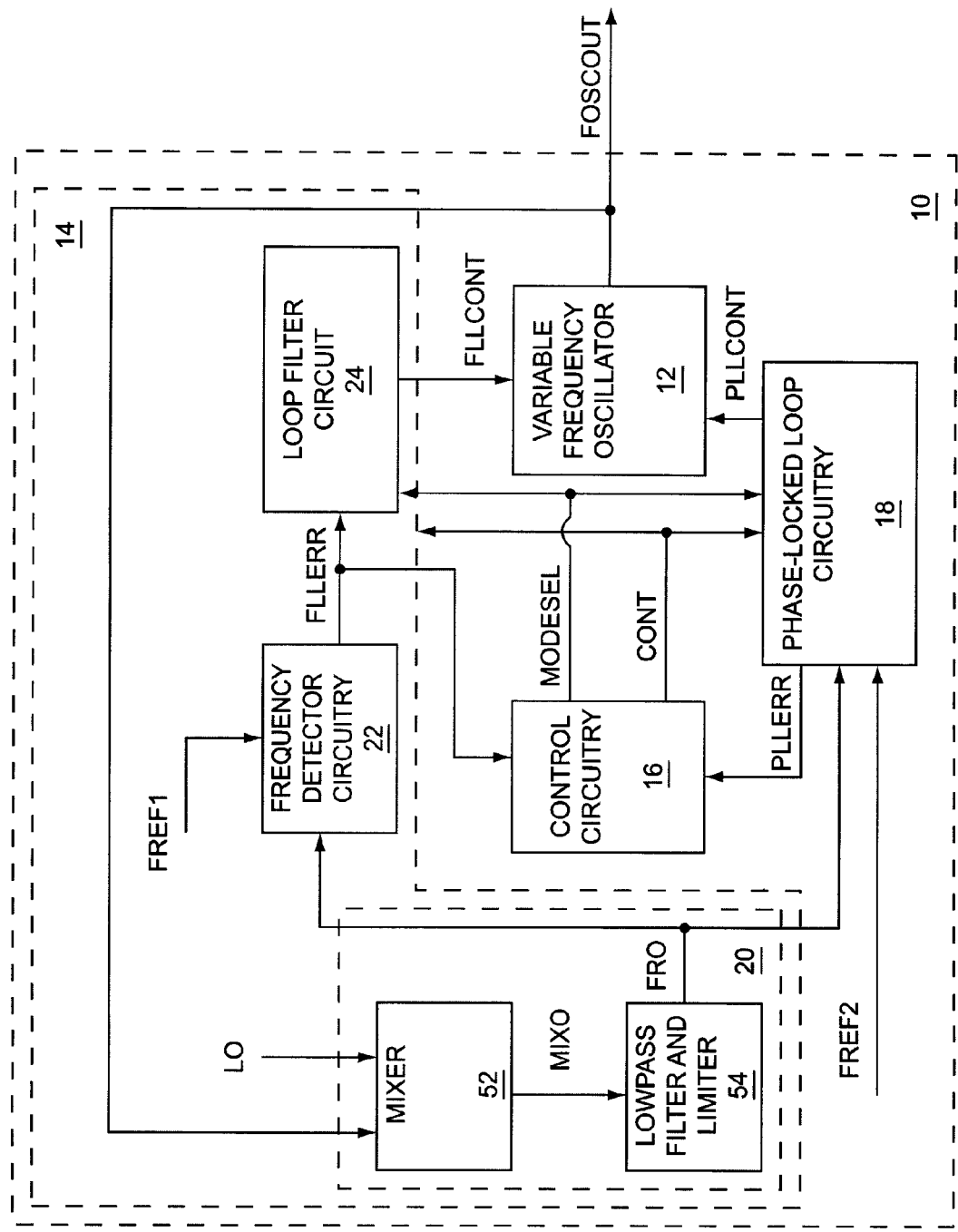
FIG. 9 shows an alternate embodiment of the frequency reduction circuit illustrated in FIG. 2.

FIG. 9 shows an alternate embodiment of the frequency reduction circuit 20 illustrated in FIG. 2. Instead of using a divider to reduce the frequency of the first oscillator output signal FOSCOUT as illustrated in the embodiment of FIG. 3, a radio frequency (RF) mixer 52 is used to reduce the frequency of the first oscillator output signal FOSCOUT by down-conversion. The frequency reduction circuit 20 may include the RF mixer 52 and a lowpass filter and limiter 54. The RF mixer 52 mixes the first oscillator output signal FOSCOUT with a local oscillator signal LO to provide a down-converted mixer output signal MIXO, which is fed into the lowpass filter and limiter 54. The lowpass filter and limiter 54 filters and limits the down-converted mixer output signal MIXO to provide the frequency reduced output signal FRO. Use of a mixer for frequency reduction has an advantage over use of a frequency divider. Unlike a frequency divider, which divides the phase and frequency of the input signal to generate the output signal, phase and frequency differences between the signals present at the RF and local oscillator (LO) input ports of a mixer are translated to phase and frequency errors in the mixer output signal without reduction in magnitude. Hence the mixer does not reduce the gains of the FLL and PLL.

A control anomaly may be present when using the RF mixer 52 in the FLL control loop as shown in the following example. The frequency of the first oscillator output signal FOSCOUT is called a first oscillator output frequency $RF_{OUT}$. A desired frequency of the first oscillator output signal FOSCOUT is called a desired first oscillator output frequency $RF_{DES}$. In this example, $RF_{DES}$ is lower in frequency than the frequency of the local oscillator signal LO, called a local oscillator frequency $RF_{LO}$, known in the art as high-side injection. In this example, a value of the FLL error signal FLLERR, called an FLL error value $V_{ERR}$, is zero when a frequency of the frequency reduced output signal FRO, called a frequency reduced output frequency $IF_{OUT}$ is approximately equal to a frequency of the first frequency reference signal FREF1, called a first reference frequency $IF_{REF}$. When $IF_{OUT}$ is approximately equal to $IF_{REF}$, then $IF_{OUT}$ is equal to a desired intermediate frequency $IF_{DES}$, and $RF_{OUT}$ is equal to $RF_{DES}$. The RF mixer 52 produces the mixer output signal MIXO having an up-conversion frequency $RF_{MIXOU}$ produced from a sum of its input signals as shown in EQ. 1, and a down-conversion frequency $IF_{MIXOD}$ produced from a difference of its input signals as shown in EQ. 2.

$$RF_{MIXOU} = RF_{LO} + RF_{OUT}. \qquad \text{EQ. 1}$$

$$IF_{MIXOD} = RF_{LO} - RF_{OUT}. \qquad \text{EQ. 2}$$

In this example, the lowpass filter and limiter 54 removes the up-conversion frequency $RF_{MIXOU}$; therefore, only the down-conversion frequency $IF_{MIXOD}$ makes it through to the frequency reduced output signal FRO, as shown in EQ. 3.

$$IF_{OUT} = IF_{MIXOD} = RF_{LO} - RF_{OUT}. \qquad \text{EQ. 3}$$

Since $RF_{OUT}$ is equal to $RF_{DES}$ when $IF_{OUT}$ is equal to $IF_{DES}$, then EQ. 4 is obtained by substitution into EQ. 3, and the FLL error value $V_{ERR}$ is given by EQ. 5. It is clear from EQ. 5 that the FLL error value $V_{ERR}$ is approximately zero when the first oscillator output frequency $RF_{OUT}$ is approximately equal to the desired first oscillator output frequency $RF_{DES}$.

$$IF_{DES} = RF_{LO} - RF_{DES}. \qquad \text{EQ. 4}$$

$$V_{ERR} = IF_{OUT} - IF_{DES} = RF_{DES} - RF_{OUT}. \qquad \text{EQ. 5}$$

Since the frequency detector circuitry 22 measures frequency errors independent of phase differences, only the absolute values of $IF_{OUT}$ and $RF_{DES}$ influence $V_{ERR}$. The behavior of the variable frequency oscillator 12 in response to $IF_{OUT}$ and $V_{ERR}$ is described by EQ. 6, EQ. 7, EQ. 8, and EQ. 9.

$$\text{If } |IF_{OUT}| < |IF_{DES}|, \text{ then } V_{ERR} = \text{positive}. \qquad \text{EQ. 6}$$

$$\text{If } V_{ERR} = \text{positive, then } RF_{OUT} \text{ is driven down}. \qquad \text{EQ. 7}$$

$$\text{If } |IF_{OUT}| > |IF_{DES}|, \text{ then } V_{ERR} = \text{negative}. \qquad \text{EQ. 8}$$

$$\text{If } V_{ERR} = \text{negative, then } RF_{OUT} \text{ is driven up}. \qquad \text{EQ. 9}$$

By examination of EQ. 3, if $RF_{OUT} < RF_{DES}$, then $IF_{OUT} > IF_{DES}$, which produces a negative FLL error signal FLLERR that drives $RF_{OUT}$ up, which is the correct response as illustrated in EQ. 10, EQ. 11, and EQ. 12.

$$\text{If } RF_{OUT} < RF_{DES}, \text{ then } IF_{OUT} > IF_{DES}. \qquad \text{EQ. 10}$$

$$\text{If } |IF_{OUT}| > |IF_{DES}|, \text{ then } V_{ERR} = \text{negative}. \qquad \text{EQ. 11}$$

$$\text{If } V_{ERR} = \text{negative, then } RF_{OUT} \text{ is driven up}. \qquad \text{EQ. 12}$$

Additionally, by examination of EQ. 3, if $RF_{OUT}>RF_{DES}$ and $RF_{OUT}<RF_{LO}$, then $IF_{OUT}$ is positive and $IF_{OUT}<IF_{DES}$, which produces a positive FLL error signal FLLERR that drives $RF_{OUT}$ down, which is the correct response as illustrated in EQ. 13, EQ. 14, and EQ. 15.

If $RF_{OUT}>RF_{DES}$, then $IF_{OUT}<IF_{DES}$. EQ. 13

If $|IF_{OUT}|<|IF_{DES}|$, then $V_{ERR}$=positive. EQ. 14

If $V_{ERR}$=positive, then $RF_{OUT}$ is driven down. EQ. 15

Further, by examination of EQ. 3, if $RF_{OUT}>RF_{DES}$ and $RF_{OUT}>RF_{LO}$, then $IF_{OUT}$ is negative, and if $RF_{OUT}<RF_{LO}+IF_{DES}$, then $|IF_{OUT}|<|IF_{DES}|$, which produces the correct response as illustrated in EQ. 13, EQ. 14, and EQ. 15. However, if $RF_{OUT}>RF_{LO}+IF_{DES}$, then $|IF_{OUT}|>|IF_{DES}|$, which produces an incorrect response that results in $V_{ERR}$ being driven increasingly negative, which further increases $RF_{OUT}$ until a circuit enters a saturated state. Therefore, in one embodiment of the present invention, to prevent the incorrect response, during the FLL operating mode, an initial value of the first oscillator output frequency $RF_{OUT}$ is less than approximately a sum of the local oscillator frequency $RF_{LO}$ and the desired intermediate frequency $IF_{DES}$.

In an alternate embodiment of the RF mixer 52, the down-conversion frequency $IF_{MIXOD}$ produced from the difference of its input signals is different from EQ. 2 as shown in EQ. 16.

$IF_{MIXOD}=RF_{OUT}-RF_{LO}$. EQ. 16

The lowpass filter and limiter 54 removes the up-conversion frequency $RF_{MIXOU}$; therefore, only the down-conversion frequency $IF_{MIXOD}$ makes it through to the frequency reduced output signal FRO, as shown in EQ. 17.

$IF_{OUT}=IF_{MIXOD}=RF_{OUT}-RF_{LO}$. EQ. 17

Since $RF_{OUT}$ is equal to $RF_{DES}$ when $IF_{OUT}$ is equal $IF_{DES}$, then EQ. 18 is obtained by substitution into EQ. 17, and the magnitude of the FLL error signal FLLERR is zero as shown in EQ. 19.

$IF_{DES}=RF_{DES}-RF_{LO}$. EQ. 18

$V_{ERR}=0$. EQ. 19

Since the frequency detector circuitry 22 measures frequency errors independent of phase differences, only the absolute values of $IF_{OUT}$ and $RF_{DES}$ influence $V_{ERR}$. The behavior of the variable frequency oscillator 12 in response to $IF_{OUT}$ and $V_{ERR}$ described is described by EQ. 20, EQ. 21, EQ. 22, and EQ. 23.

If $|IF_{OUT}|<|IF_{DES}|$, then $V_{ERR}$=positive. EQ. 20

If $V_{ERR}$=positive, then $RF_{OUT}$ is driven up. EQ. 21

If $|IF_{OUT}|>|IF_{DES}|$, then $V_{ERR}$=negative. EQ. 22

If $V_{ERR}$=negative, then $RF_{OUT}$ is driven down. EQ. 23

By examination of EQ. 17, if $RF_{OUT}>RF_{DES}$, then $IF_{OUT}>IF_{DES}$, which produces a negative FLL error signal FLLERR that drives $RF_{OUT}$ down, which is the correct response as illustrated in EQ. 24, EQ. 25, and EQ. 26.

If $RF_{OUT}>RF_{DES}$, then $IF_{OUT}>IF_{DES}$. EQ. 24

If $|IF_{OUT}|>|IF_{DES}|$, then $V_{ERR}$=negative. EQ. 25

If $V_{ERR}$=negative, then $RF_{OUT}$ is driven down. EQ. 26

Additionally, by examination of EQ. 17, if $RF_{OUT}<RF_{DES}$ and $RF_{OUT}<RF_{LO}$, then $IF_{OUT}$ is negative, and if $RF_{OUT}>RF_{LO}-IF_{DES}$, then $|IF_{OUT}|<|IF_{DES}|$, which produces a positive FLL error signal FLLERR that drives $RF_{OUT}$ up, which is the correct response as illustrated in EQ. 27, EQ. 28, and EQ. 29.

If $RF_{OUT}<RF_{DES}$, then $IF_{OUT}<IF_{DES}$. EQ. 27

If $|IF_{OUT}|<|IF_{DES}|$, then $V_{ERR}$=positive. EQ. 28

If $V_{ERR}$=positive, then $RF_{OUT}$ is driven up. EQ. 29

Further, by examination of EQ. 17, if $RF_{OUT}<RF_{DES}$ and $RF_{OUT}<RF_{LO}$, then $IF_{OUT}$ is negative, and if $RF_{OUT}>RF_{LO}-IF_{DES}$, then $|IF_{OUT}|<|IF_{DES}|$, which produces the correct response as illustrated in EQ. 27, EQ. 28, and EQ. 29. However, if $RF_{OUT}<RF_{LO}-IF_{DES}$, then $|IF_{OUT}|>|IF_{DES}|$, which produces an incorrect response that results in $V_{ERR}$ being driven increasingly negative, which further decreases $RF_{OUT}$ until a circuit enters a saturated state. Therefore, in one embodiment of the present invention, to prevent the incorrect response, during the FLL operating mode, an initial value of the first oscillator output frequency $RF_{OUT}$ is greater than a threshold value, which is approximately equal to the local oscillator frequency $RF_{LO}$ minus the desired intermediate frequency $IF_{DES}$.

Figure 10:
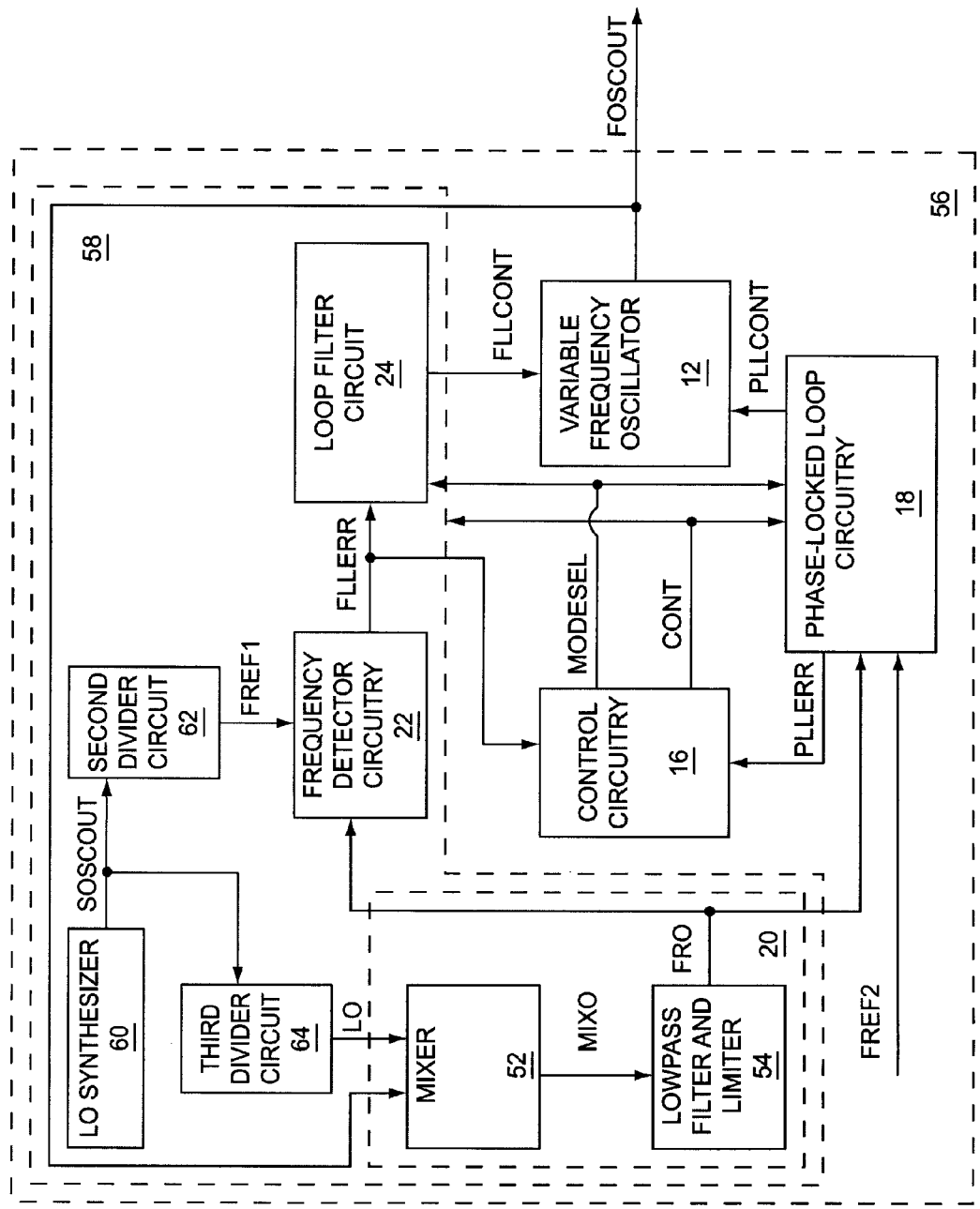
FIG. 10 shows a dual loop synthesizer, according to an alternate embodiment of the present invention.

FIG. 10 shows a dual loop synthesizer 56, according to an alternate embodiment of the present invention. The dual loop synthesizer 56 includes the variable frequency oscillator 12, the control circuitry 16, the phase-locked loop circuitry 18, and a dual loop frequency-locked loop circuit 58 instead of the frequency-locked loop circuitry 14 illustrated in FIG. 1. The dual loop frequency-locked loop circuit 58 includes the frequency detector circuitry 22, the loop filter circuit 24, the RF mixer 52, and the lowpass filter and limiter 54 illustrated in FIG. 9, and an LO synthesizer 60, a second divider circuit 62, and a third divider circuit 64. The LO synthesizer 60 provides a second oscillator output signal SOSCOUT to the second and third divider circuits 62, 64. The second divider circuit 62 divides the second oscillator output signal SOSCOUT to provide the first frequency reference signal FREF1. The third divider circuit 64 divides the second oscillator output signal SOSCOUT to provide the local oscillator signal LO. In an exemplary embodiment of the present invention, a frequency of the second oscillator output signal SOSCOUT is approximately two times the local oscillator frequency $RF_{LO}$. It will be appreciated by those skilled in the art that frequency dividers can be employed at different points in the FPLL synthesizer 10 without substantially modifying the operation of the system. The use of frequency dividers at different points in the system is optimized in the design process to make various design trade-offs for frequency of operation of the circuits affecting current drain, noise performance, and accuracy of the tuning algorithms. In an alternate embodiment of the present invention, the third divider circuit 64 is omitted and the second oscillator output signal SOSCOUT provides the local oscillator signal LO directly.

In one embodiment of the present invention, the LO synthesizer 60 may have a second loop FLL mode for coarse tuning and a second loop PLL mode for fine tuning. Additionally, the second loop FLL mode may be sub-divided into a second loop acquisition mode and a second loop average and interpolate mode. Coarse tuning of the variable frequency oscillator 12 may begin approximately upon or after completion of coarse tuning the LO synthesizer 60, fine tuning the LO synthesizer 60, the second loop FLL mode, the second loop acquisition mode, or the second loop PLL mode. Fine tuning of the variable frequency oscillator 12 may begin approximately upon or after completion of fine tuning the LO synthesizer 60, the second loop FLL mode, the second loop average and interpolate mode, or the second loop PLL mode. Components, such as capacitive elements, in a variable frequency oscillator in the LO synthesizer 60 may have matching characteristics with components in the variable frequency oscillator 12; therefore, an initial tuning value for the variable frequency oscillator 12 may be based on or equal to a completion tuning value of the LO synthesizer 60 upon completion of coarse tuning the LO synthesizer 60, fine tuning the LO synthesizer 60, the second loop FLL mode, the second loop acquisition mode, or the second loop PLL mode. Alternatively, coarse tuning of the variable frequency oscillator 12 may begin based on timing from tuning the LO synthesizer 60.

Figure 11:
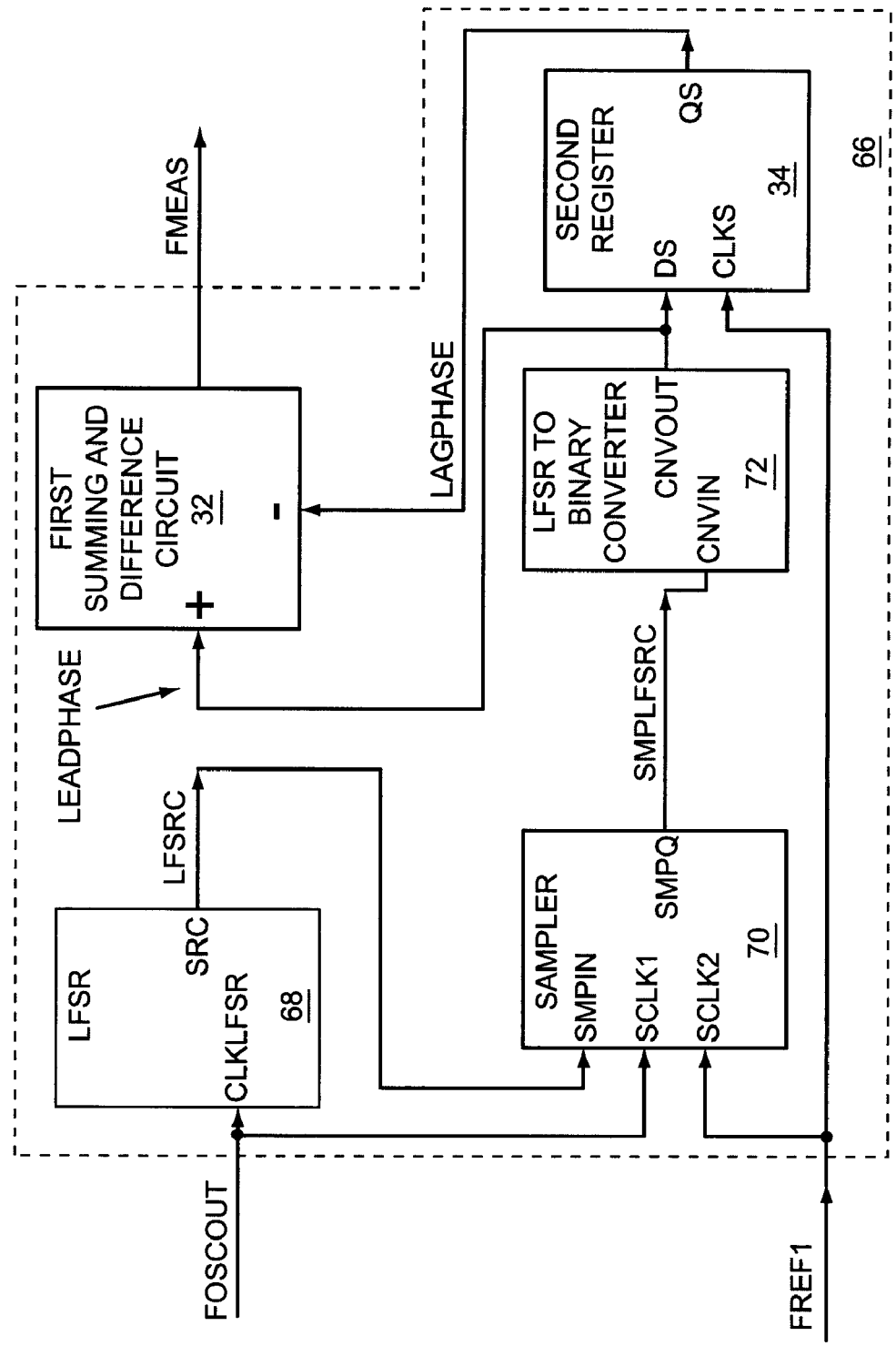
FIG. 11 shows a high resolution frequency measurement circuit, according to a third embodiment of the present invention.

FIG. 11 shows a high resolution frequency measurement circuit 66 according to a third embodiment of the present invention. The high resolution frequency measurement circuit 66 is similar to frequency measuring circuitry 22 illustrated in FIG. 5, except the binary counter 28 (FIG. 5) and the first register 30 (FIG. 5) are replaced with a linear feedback shift register (LFSR) 68, a sampler 70, and an LFSR to binary converter 72. The LFSR 68 may operate at a much higher frequency than the binary counter 28 due to a simplified architecture. Therefore, the LFSR 68 may directly measure the frequency of the first oscillator output signal FOSCOUT, whereas the binary counter 28 measures the frequency of the frequency reduced output signal FRO, which is less than the frequency of the first oscillator output signal FOSCOUT. In one embodiment of the present invention, the high resolution frequency measurement circuit 66 functions as a stand-alone frequency measurement circuit, whereas in an alternate embodiment of the present invention, the high resolution frequency measurement circuit 66 is integrated with other circuitry, such as frequency synthesis circuitry.

Frequency may be measured by counting the number of cycles of the first oscillator output signal FOSCOUT that occur during a specified time period, which may be at least one period of the first frequency reference signal FREF1. The first oscillator output signal FOSCOUT feeds a first sampler clock input SCLK1 of the sampler 70 and an LFSR clock input CLKLFSR of the LFSR 68, which counts cycles of the first oscillator output signal FOSCOUT and provides an ongoing LFSR count LFSRC from an LFSR count output SRC of the LFSR 68 to a sampler input SMPIN of the sampler 70. The first frequency reference signal FREF1 feeds a second sampler clock input SCLK2 of the sampler 70. Since the LFSR count LFSRC advances based on the first oscillator output signal FOSCOUT, the sampler 70 samples the LFSR count LFSRC using a clock that has been synchronized to the first oscillator output signal FOSCOUT to prevent input errors. The sampler 70 provides a sampled LFSR count SMPLFSRC from a sampler output SMPQ of the sampler 70 to a converter input CNVIN of the LFSR to binary converter 72. The sampled LFSR count SMPLFSRC is based on sampling a value of the LFSR count LFSRC using the first frequency reference signal FREF1. The LFSR to binary converter 72 converts the sampled LFSR count SMPLFSRC into a corresponding binary count, which is provided from a converter output CNVOUT as the leading count signal LEADPHASE. During one cycle of the first frequency reference signal FREF1, the leading count signal LEADPHASE may be indicative of an instantaneous phase of the first oscillator output signal FOSCOUT as sampled at the end of the previous cycle of the first frequency reference signal FREF1. Therefore, the LFSR 68, the sampler 70, and the LFSR to binary converter 72 may form a high resolution phase measurement circuit, according to one embodiment of the present invention.

The difference between one binary count and the binary count from the previous cycle of the first frequency reference signal FREF1 is indicative of the phase change of the first oscillator output signal FOSCOUT, which is given as whole periods of the first oscillator output signal FOSCOUT during one period of the first frequency reference signal FREF1. Since frequency may be defined as the time rate of change of phase, the difference between the one binary count and the binary count from the previous cycle is indicative of frequency. As previously discussed, the leading count signal LEADPHASE feeds the first summing input + of the first summing and difference circuit 32 and the second data input DS of the second register 34, which includes the second data output QS and the second clock input CLKS. The first frequency reference signal FREF1 feeds the second clock input CLKS of the second register 34. On a subsequent edge of the first frequency reference signal FREF1, the value of the LFSR 68 that was previously clocked into the sampler 70 is converted into binary and clocked into the second register 34, and then appears at the second data output QS, which provides the lagging count signal LAGPHASE. The lagging count signal LAGPHASE feeds the first difference input − of the first summing and difference circuit 32, which provides the output signal, called the measured frequency signal FMEAS, based on a difference between the signal at the first summing input + and the signal at the first difference input −.

At any time after an edge of the first frequency reference signal FREF1, such that the converter output CNVOUT and the second data output QS have had time to stabilize, the difference between the leading count signal LEADPHASE and the lagging count signal LAGPHASE is approximately equal to the number of cycles of the first oscillator output signal FOSCOUT counted between the two edges of the first frequency reference signal FREF1. The number of cycles counted is proportional to the frequency of the first oscillator output signal FOSCOUT; therefore, the measured frequency signal FMEAS is proportional to the frequency of the first oscillator output signal FOSCOUT.

The LFSR 68, the sampler 70, and the LFSR to binary converter 72 in combination may function in a similar manner to the binary counter 28 and the first register 30 combination illustrated in FIG. 5. One difference is that an n-bit binary counter 28 is a modulo $2^n$ counter, whereas the LFSR 68, the sampler 70, and the LFSR to binary converter 72 combination is a modulo $(2^n-1)$ counter. It will be appreciated by those skilled in the art that additional embodiments may replace any or all of the LFSR 68, the sampler 70, and the LFSR to binary converter 72 with another digital sequence generating circuit with a decoding circuit to provide an equivalent measure of the elapsed count. The LFSR 68 may be replaced with two or more shift register circuits having corresponding linear feedback circuits or having interconnected linear feedback circuits, or the LFSR 68 may be replaced with any digital sequence generating circuit to form a modulo $2^n$ counter, a modulo $(2^n-1)$ counter, or a modulo $(2^n-m)$ counter, where m is any number less than n. The LFSR to binary converter 72 may include at least one look-up table (LUT) used in a look-up table system to facilitate conversion of the sampled LFSR count SMPLFSRC into a corresponding binary count.

Figure 12:
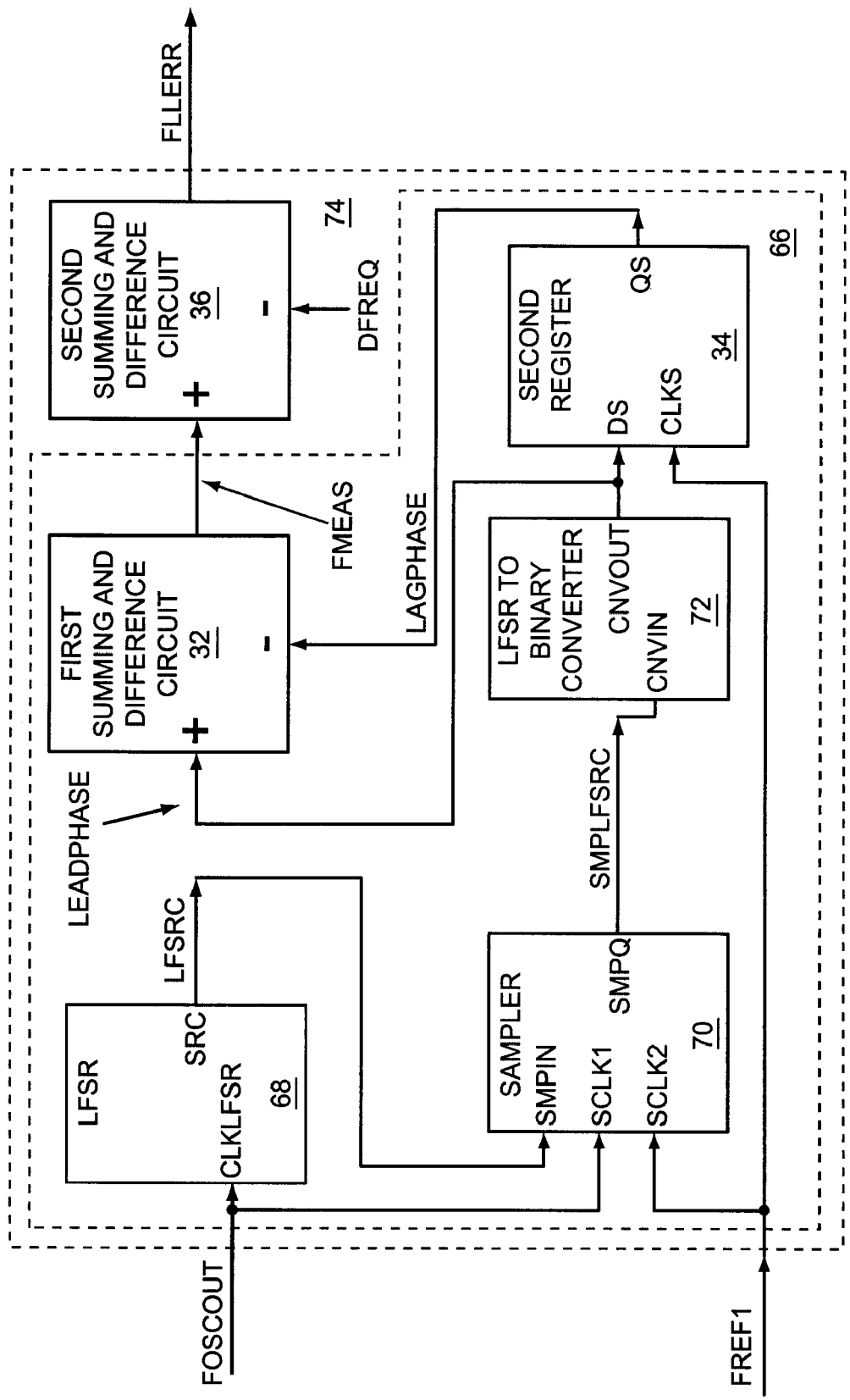
FIG. 12 shows high resolution frequency detector circuitry, according to one embodiment of the present invention.

FIG. 12 shows high resolution frequency detector circuitry 74 according to one embodiment of the present invention. The high resolution frequency detector circuitry 74 includes the high resolution frequency measurement circuit 66 illustrated in FIG. 11 and the second summing and difference circuit 36 illustrated in FIG. 5, and may function in a logically identical manner to the frequency detector circuitry 22 illustrated in FIG. 5. The high resolution frequency detector circuitry 74 provides the FLL error signal FLLERR by measuring the frequency of the first oscillator output signal FOSCOUT and subtracting out a desired frequency, which is provided by the desired frequency value DFREQ. The measured frequency signal FMEAS feeds the second summing input + of the second summing and difference circuit 36. The desired frequency signal DFREQ feeds the second difference input − of the second summing and difference circuit 36, which provides the FLL error signal FLLERR based on a difference between the measured frequency signal FMEAS and the desired frequency signal DFREQ.

Figure 13:
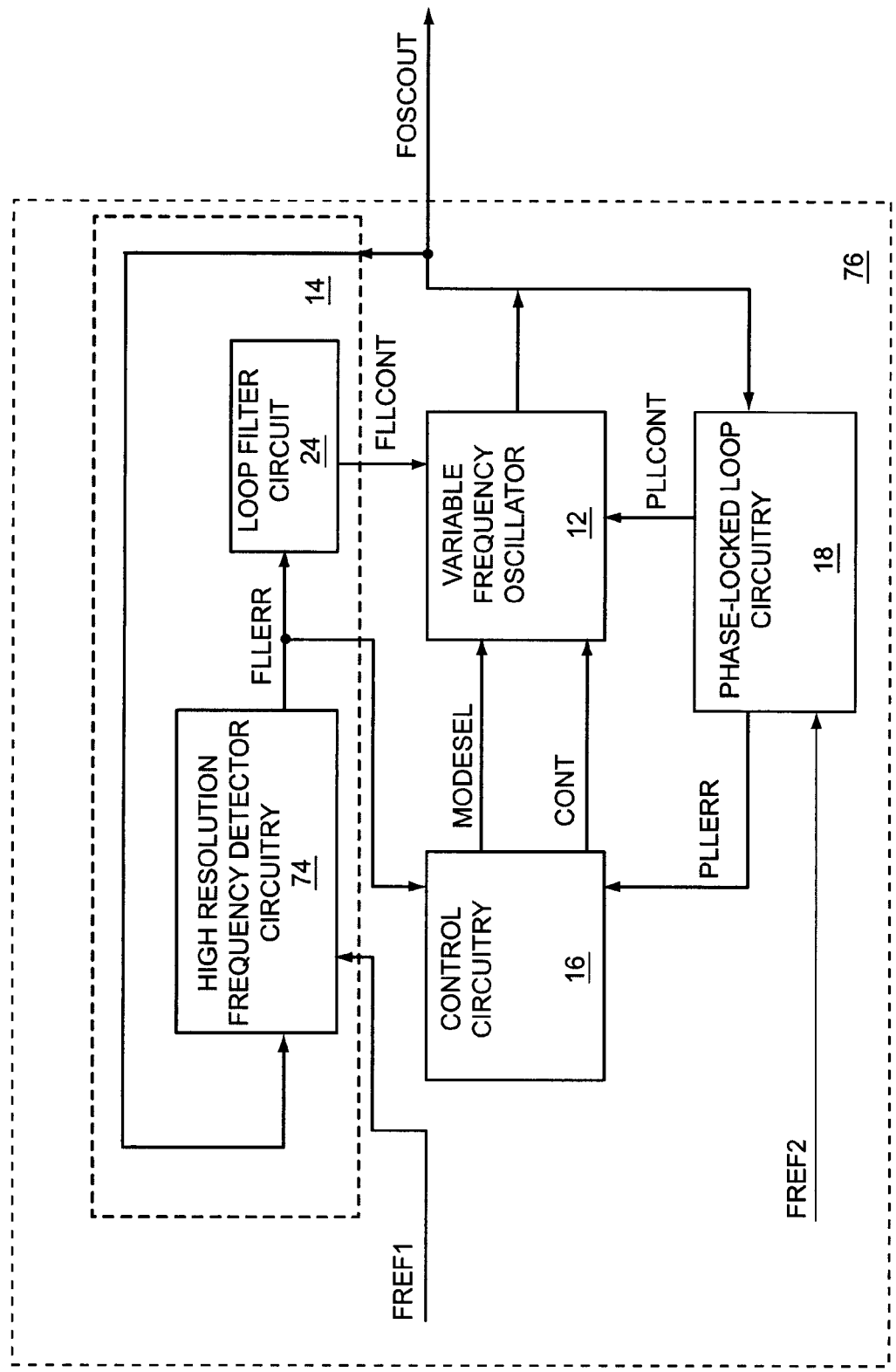
FIG. 13 shows a high resolution FPLL synthesizer, according to a fourth embodiment of the present invention.

FIG. 13 shows a high resolution FPLL synthesizer 76 according to a fourth embodiment of the present invention. The high resolution FPLL synthesizer 76 is similar to the FPLL synthesizer 10 illustrated in FIG. 2, except the frequency reduction circuit 20 and the frequency detector circuitry 22 illustrated in FIG. 2 are replaced with the high resolution frequency detector circuitry 74 illustrated in FIG. 12. The first oscillator output signal FOSCOUT feeds the high resolution frequency detector circuitry 74, which receives the first frequency reference signal FREF1, and provides the FLL error signal FLLERR to the control circuitry 16 and to the loop filter circuit 24. The FLL error signal FLLERR may be based on a frequency difference between the frequency of first oscillator output signal FOSCOUT and a multiple of the frequency of the first frequency reference signal FREF1. The loop filter circuit 24 includes a filter, such as a lowpass filter or an integrator, and filters the FLL error signal FLLERR to provide the FLL control signal FLLCONT. Those skilled in the art will recognize that the frequency-locked loop circuitry 14 forms a negative-feedback control system, which automatically determines a value for the FLL control signal FLLCONT that minimizes the average value of the FLL error signal FLLERR.

Figure 14:
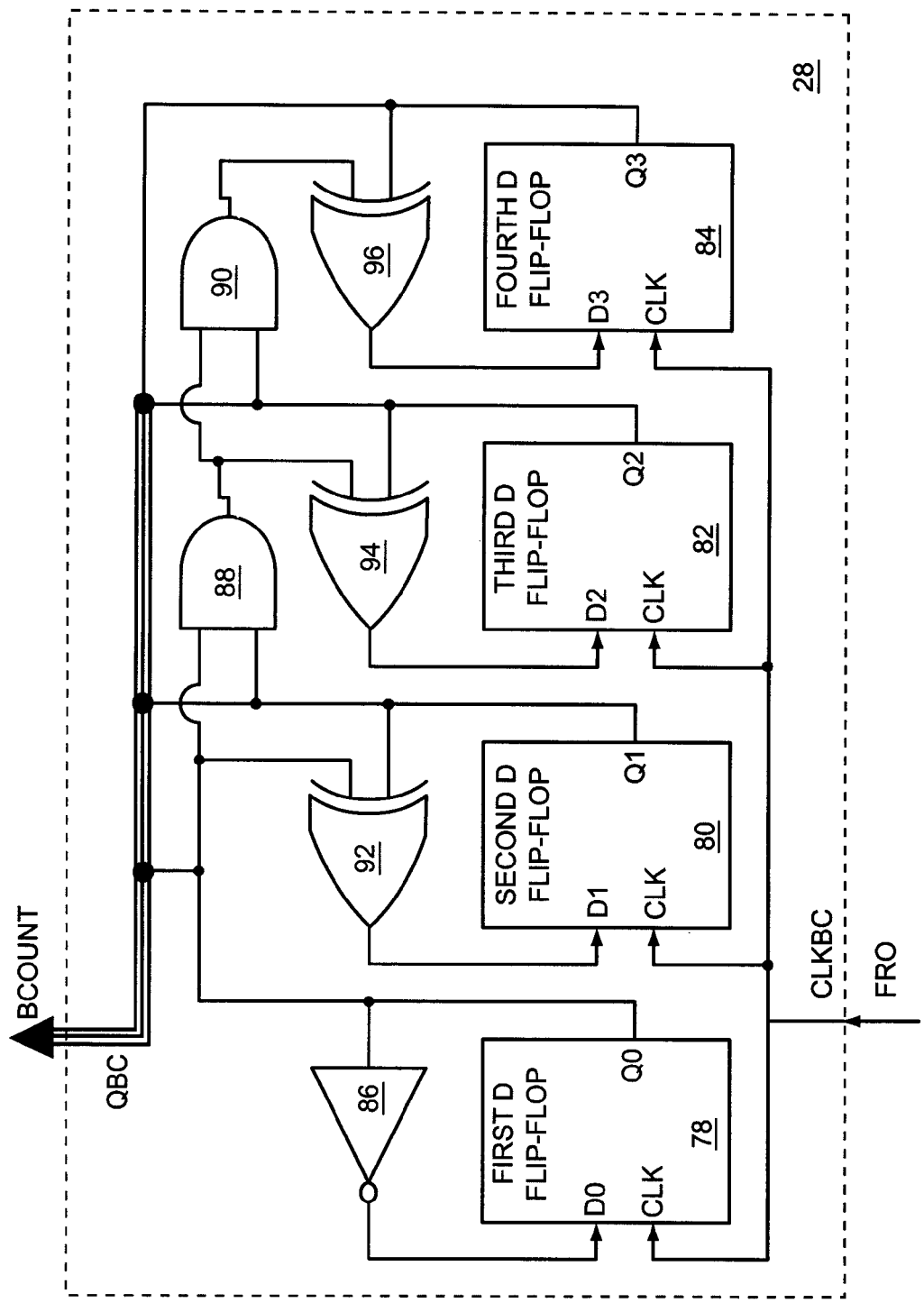
FIG. 14 shows details of a binary counter illustrated in FIG. 5.

FIG. 14 shows details of the binary counter 28 illustrated in FIG. 5, according to one embodiment of the present invention. The binary counter 28 includes a first D flip-flop 78, a second D flip-flop 80, a third D flip-flop 82, a fourth D flip-flop 84, an inverter 86, a first AND gate 88, a second AND gate 90, a first exclusive OR gate 92, a second exclusive OR gate 94, and a third exclusive OR gate 96. Each of the first, second, third, and fourth D flip-flops 78, 80, 82, 84 includes a clock input CLK, a first, second, third, and fourth data input D0, D1, D2, D3, respectively, and a first, second, third, and fourth data output Q0, Q1, Q2, Q3, respectively.

The binary counter clock input CLKBC is coupled to the clock input CLK of each of the first, second, third, and fourth D flip-flops 78, 80, 82, 84. The first, second, third, and fourth data outputs Q0, Q1, Q2, Q3 are coupled to the binary counter data output QBC to provide the binary count output signal BCOUNT, which is a 4-bit signal. The first data output Q0 feeds the inverter 86, a first input of the first AND gate 88, and a first input of the first exclusive OR gate 92. The inverter 86 feeds the first data input D0. The second data output Q1 feeds a second input of the first AND gate 88 and a second input of the first exclusive OR gate 92. The first exclusive OR gate 92 feeds the second data input D1 and the first AND gate 88 feeds a first input of the second AND gate 90 and a first input of the second exclusive OR gate 94. The third data output Q2 feeds a second input of the second AND gate 90 and a second input of the second exclusive OR gate 94. The second exclusive OR gate 94 feeds the third data input D2. The second AND gate 90 feeds a first input of the third exclusive OR gate 96 and the fourth data output Q3 feeds a second input of the third exclusive OR gate 96. The third exclusive OR gate 96 feeds the fourth data input D3.

The maximum clock rate of the binary counter 28 is limited by the propagation delay of the longest path, which includes the propagation delay through the first D flip-flop 78, through the first AND gate 88, through the second AND gate 90, and through the third exclusive OR gate 96. Alternate embodiments of the binary counter 28 may have more than 4-bits or fewer than 4-bits. A binary counter 28 having more than 4-bits would have a longer path, and longer corresponding propagation delay, than the binary counter 28 illustrated in FIG. 14. Therefore, such a binary counter 28 would have a further reduced maximum clock rate.

Figure 15:
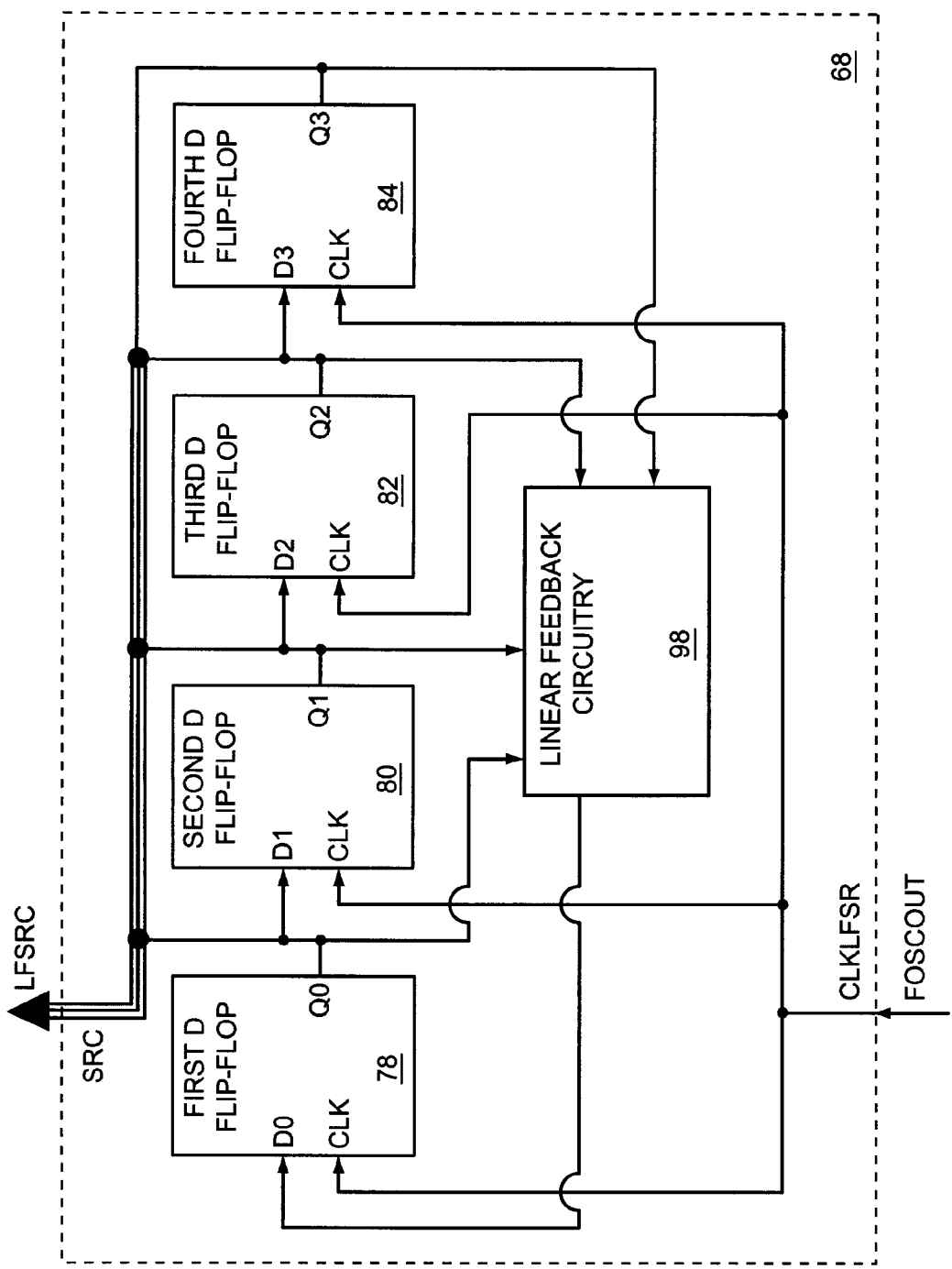
FIG. 15 shows details of a linear feedback shift register (LFSR) illustrated in FIG. 11.

FIG. 15 shows details of the LFSR 68 illustrated in FIG. 11. The LFSR 68 includes the first D flip-flop 78, the second D flip-flop 80, the third D flip-flop 82, the fourth D flip-flop 84, and linear feedback circuitry 98. The LFSR clock input CLKLFSR is coupled to the clock input CLK of each of the first, second, third, and fourth D flip-flops 78, 80, 82, 84. The first, second, third, and fourth data outputs Q0, Q1, Q2, Q3 are coupled to the LFSR count output SRC to provide the LFSR count LFSRC, which is a 4-bit count. Additionally, any or all of the first, second, third, and fourth data outputs Q0, Q1, Q2, Q3 may feed the linear feedback circuitry 98, which includes linear feedback circuitry to feed the first data input D0. The first data output Q0 feeds the second data input D1, the second data output Q1 feeds the third data input D2, and the third data output Q2 feeds the fourth data input D3 to form a shift register. Therefore, at each cycle of the first oscillator output signal FOSCOUT, the first D flip-flop 78 clocks in the feedback from the linear feedback circuitry 98, the second D flip-flop 80 clocks in the data from the first D flip-flop 78, the third D flip-flop 82 clocks in the data from the second D flip-flop 80, and the fourth D flip-flop 84 clocks in the data from the third D flip-flop 82.

Figure 16:
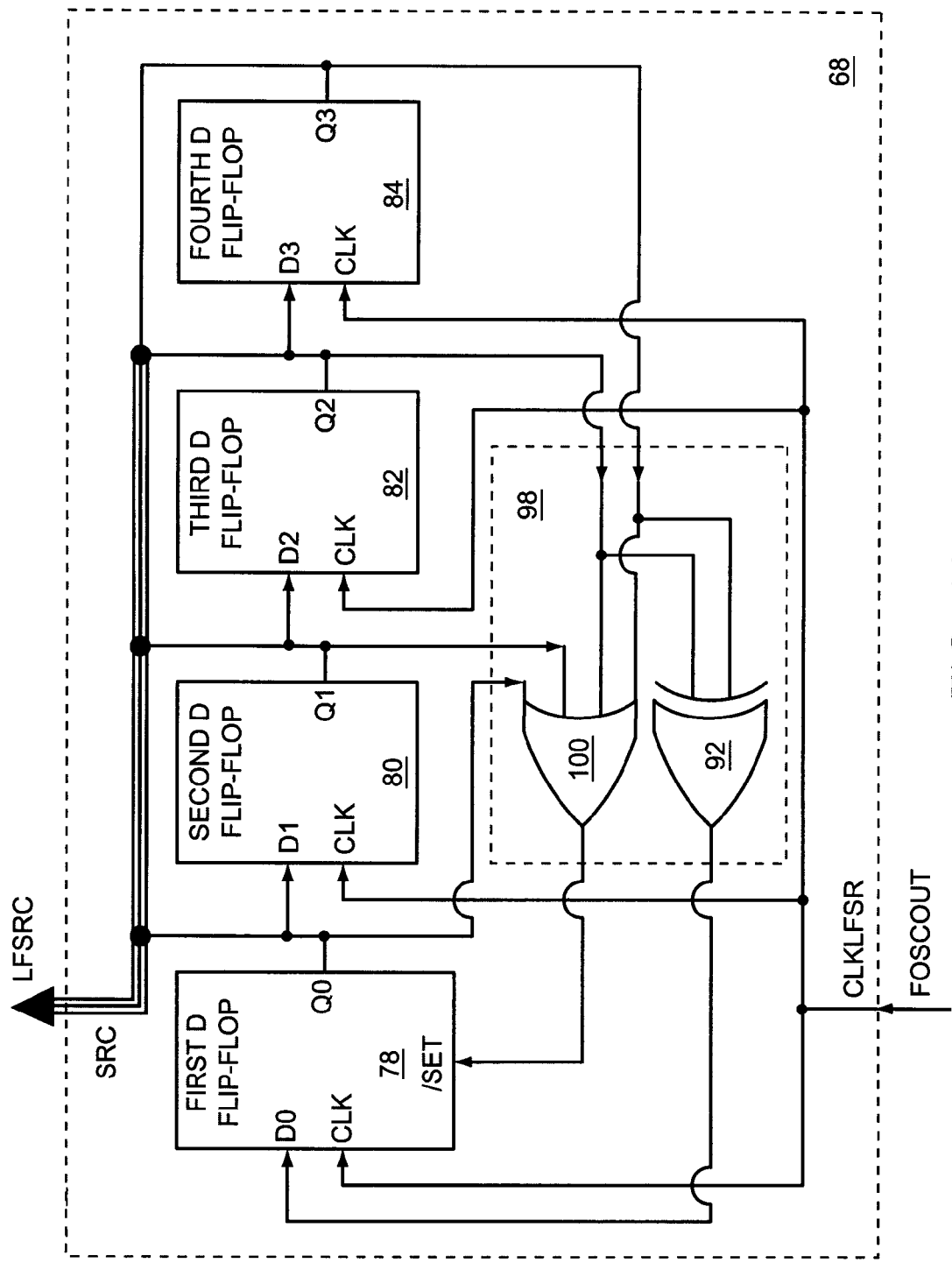
FIG. 16 shows details of one embodiment of linear feedback circuitry illustrated in FIG. 15.

FIG. 16 shows details of one embodiment of the linear feedback circuitry 98 illustrated in FIG. 15. The linear feedback circuitry 98 includes the first exclusive OR gate 92 and a first OR gate 100. The first, second, third, and fourth data outputs Q0, Q1, Q2, Q3 feed the first OR gate 100, which feeds a set input /SET in the first D flip-flop 78. The third and fourth data outputs Q2, Q3 feed the first exclusive OR gate 92, which feeds the first data input D0. The first, second, third, and fourth D flip-flops 78, 80, 82, 84 form a shift register and the first exclusive OR gate 92 provides linear feedback to provide a system that sequences through 15 different combinations of the first, second, third, and fourth data outputs Q0, Q1, Q2, Q3.

The combination of all four of the first, second, third, and fourth data outputs Q0, Q1, Q2, Q3 having a logic "0" is not used. Therefore, the first, second, third, and fourth D flip-flops 78, 80, 82, 84 provide a modulo 15 counter having LFSR coding. The binary counter 28 (FIG. 5) provides a modulo 16 counter having binary coding. The LFSR to binary converter 72 converts the LFSR coding to binary coding. Since the LFSR coding is modulo 15, the binary converted LFSR coding must have one binary value removed from the binary count sequence. The removed binary value may be any of the 16 possible binary values. In an exemplary embodiment of the present invention, the removed binary value is 1111, such that the binary count rolls over from 1110 to 0000, as illustrated in Table 1 below. The first OR gate 100 is used to prevent the combination of all four of the first, second, third, and fourth data outputs Q0, Q1, Q2, Q3 having a logic "0" by setting the first D flip-flop 78 if the combination occurs.

As previously discussed, the maximum clock rate of the binary counter 28 illustrated in FIG. 14 is limited by the propagation delay of the longest path, which includes the propagation delay through the first D flip-flop 78 (FIG. 14), through the first AND gate 88 (FIG. 14), through the second AND gate 90 (FIG. 14), and through the third exclusive OR gate 96 (FIG. 14). However, the maximum clock rate of the LFSR 68 is limited by the propagation delay of the longest path, which includes the propagation delay through the third D flip-flop 82 or the fourth D flip-flop 84, and through the first exclusive OR gate 92. Therefore, the longest path in the LFSR 68 is shorter than the longest path in the binary counter 28 (FIG. 14). Alternate embodiments of the LFSR 68 may have more than 4-bits or fewer than 4-bits. However, an LFSR 68 having more than 4-bits may have an equivalent path to a 4-bit LFSR 68. Therefore, such an LFSR 68 may have a maximum clock rate equal to a 4-bit LFSR 68.

TABLE 1

| OUTPUT OF BINARY COUNTER 28 Q3 Q2 Q1 Q0 | OUTPUT OF LFSR 68 Q3 Q2 Q1 Q0 | OUTPUT OF LFSR TO BINARY CONVERTER 72 Q3 Q2 Q1 Q0 |
|---|---|---|
| 0000 | 0001 | 0000 |
| 0001 | 0010 | 0001 |
| 0010 | 0100 | 0010 |
| 0011 | 1001 | 0011 |
| 0100 | 0011 | 0100 |
| 0101 | 0110 | 0101 |
| 0110 | 1101 | 0110 |
| 0111 | 1010 | 0111 |
| 1000 | 0101 | 1000 |
| 1001 | 1011 | 1001 |
| 1010 | 0111 | 1010 |
| 1011 | 1111 | 1011 |
| 1100 | 1110 | 1100 |
| 1101 | 1100 | 1101 |
| 1110 | 1000 | 1110 |
| 1111 | 0001 | 0000 |
| 0000 | 0010 | 0001 |
| 0001 | 0100 | 0010 |
| 0010 | 1001 | 0011 |
| 0011 | 0011 | 0100 |
| 0100 | 0110 | 0101 |
| 0101 | 1101 | 0110 |
| 0110 | 1010 | 0111 |

Figure 17:
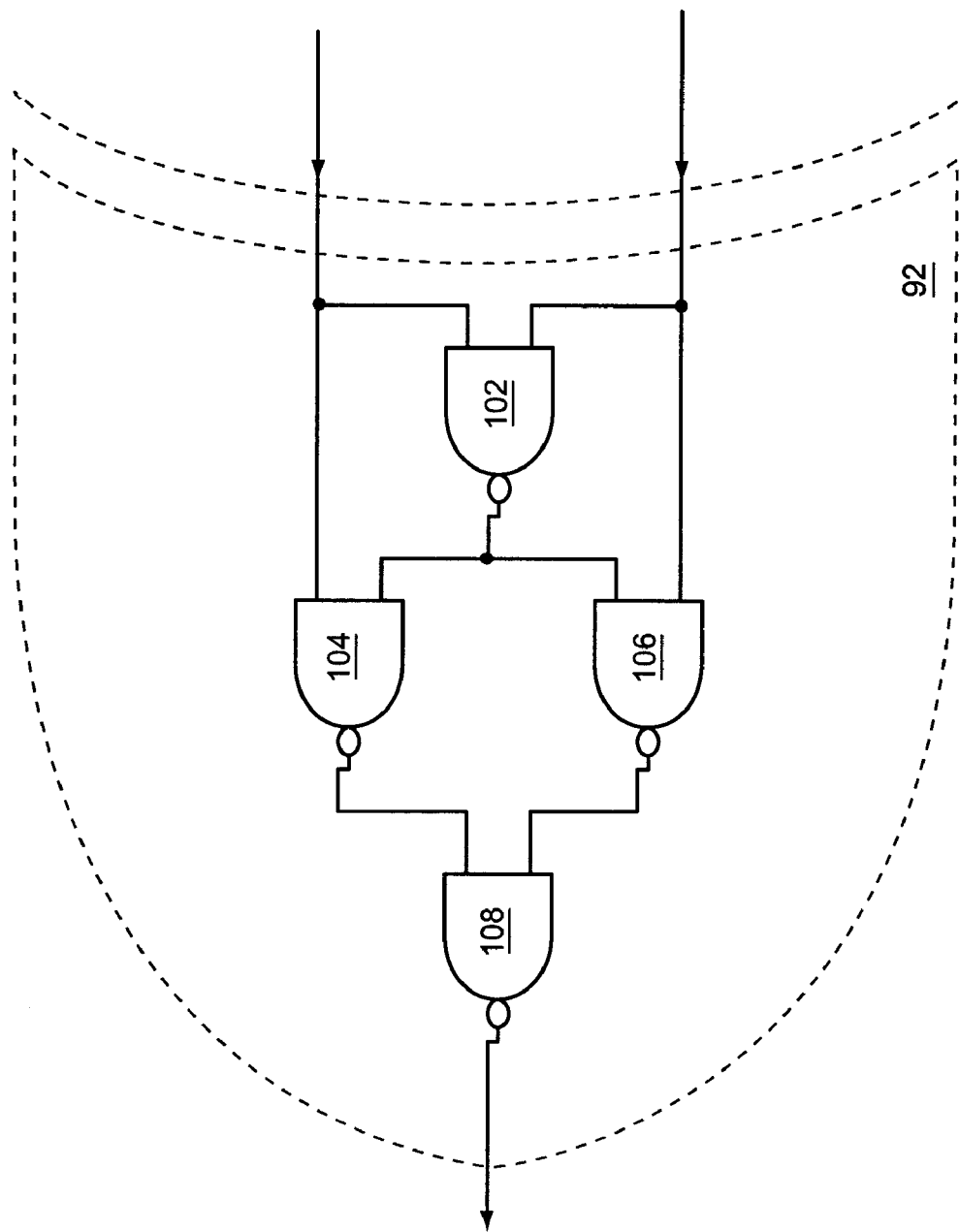
FIG. 17 shows details of a first exclusive OR gate illustrated in FIG. 16.

FIG. 17 shows details of the first exclusive OR gate 92 illustrated in FIG. 16, according to one embodiment of the first exclusive OR gate 92. The first exclusive OR gate 92 includes a first NAND gate 102, a second NAND gate 104, a third NAND gate 106, and a fourth NAND gate 108. One input to the first exclusive OR gate 92 is coupled to a first input of the first NAND gate 102 and to a first input of the second NAND gate 104. The other input to the first exclusive OR gate 92 is coupled to a first input of the third NAND gate 106 and to a second input of the first NAND gate 102. The output of the first NAND gate 102 is coupled to a second input of the second NAND gate 104 and to a second input of the third NAND gate 106. The output of the second NAND gate 104 is coupled to a first input of the fourth NAND gate 108, and the output of the third NAND gate 106 is coupled to a second input of the fourth NAND gate 108. The output of the fourth NAND gate 108 provides the output of the first exclusive OR gate 92. Since the first NAND gate 102 is coupled in series with the second and the third NAND gates 104, 106, which are coupled in series with the fourth NAND gate 108, the propagation delay through the first exclusive OR gate 92 may be about equal to about three times the propagation delay through one of the first, the second, the third, and the fourth NAND gates 102, 104, 106, 108.

Figure 18:
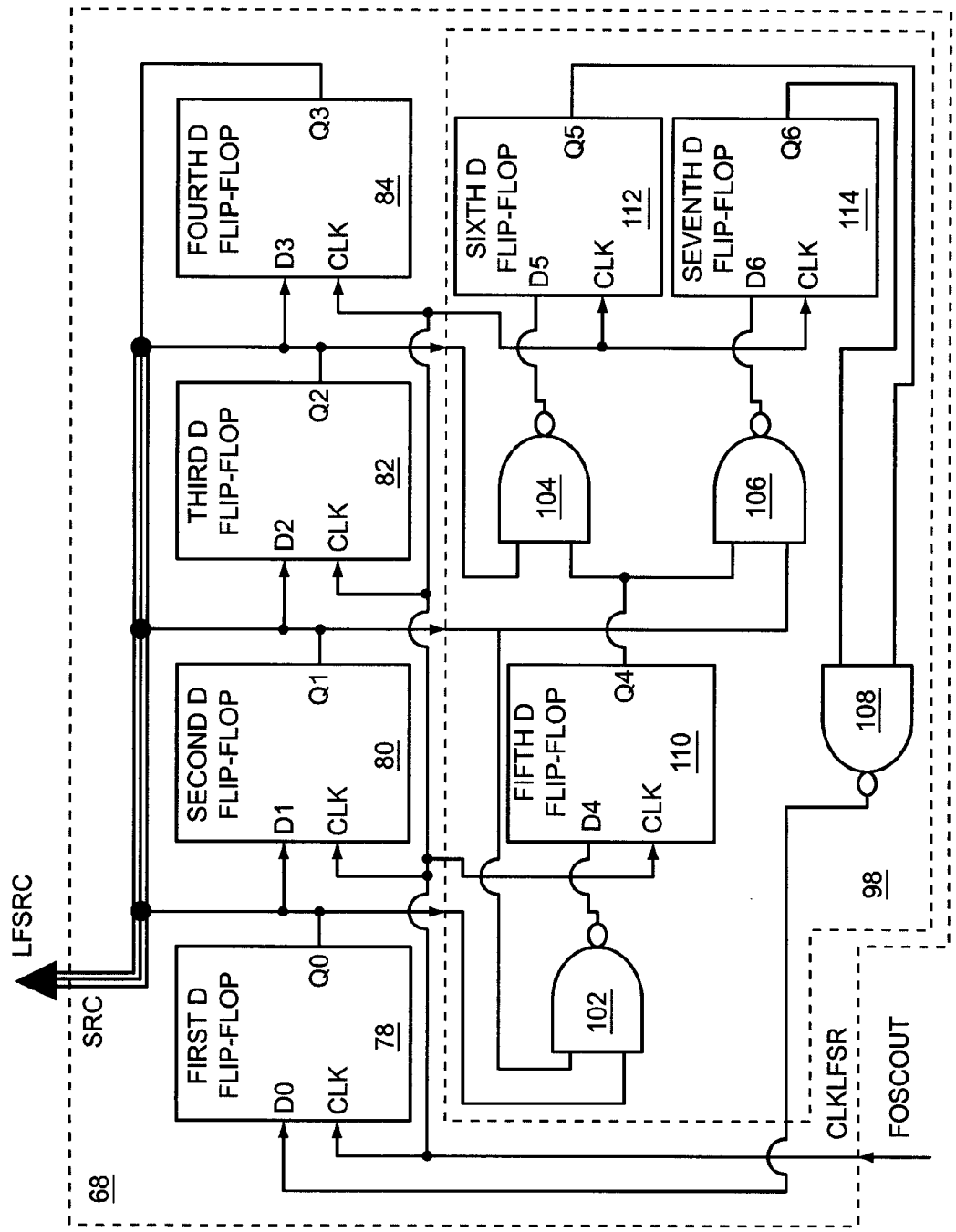
FIG. 18 shows details of an alternate embodiment of the linear feedback circuitry illustrated in FIG. 15.

FIG. 18 shows details of an alternate embodiment of the linear feedback circuitry 98 illustrated in FIG. 15. The linear feedback circuitry 98 uses pipelining to take advantage of the shift register architecture of the LFSR 68 to reduce propagation delay through the linear feedback circuitry 98 from about three times the propagation delay through one of the first, the second, the third, and the fourth NAND gates 102, 104, 106, 108 to about one times the propagation delay through one of the first, the second, the third, and the fourth NAND gates 102, 104, 106, 108. The linear feedback circuitry 98 includes the first, the second, the third, and the fourth NAND gates 102, 104, 106, 108, a fifth D flip-flop 110, a sixth D flip-flop 112, and a seventh D flip-flop 114. Each of the fifth, sixth, and seventh D flip-flops 110, 112, 114 includes a clock input CLK, a fifth, sixth, and seventh data input D4, D5, D6, respectively, and a fifth, sixth, and seventh data output Q4, Q5, Q6, respectively.

The LFSR clock input CLKLFSR of the LFSR 68 is coupled to the clock input CLK of each of the fifth, sixth, and seventh D flip-flops 110, 112, 114. The first and the second data outputs Q0, Q1 feed the first NAND gate 102. The output of the first NAND gate 102 feeds the fifth data input D4, and the fifth data output Q4 feeds first inputs of the second and the third NAND gates 104, 106. Functionally, the combination of the first NAND gate 102 and the fifth D flip-flop 110 is equivalent to feeding the first NAND gate 102 with the second and the third data outputs Q1, Q2 and feeding the first inputs of the second and the third NAND gates 104, 106 directly from the output of the first NAND gate 102. The third and the second data outputs Q2, Q1 feed the second inputs of the second and the third NAND gates 104, 106, respectively. The outputs of the second and the third NAND gates 104, 106 feed the sixth and the seventh data inputs D5, D6, respectively. The sixth and the seventh data outputs Q5, Q6 feed the inputs to the fourth NAND gate 108. The output of the fourth NAND gate 108 feeds the first data input D0.

Functionally the combination of the first, the second, the third, and the fourth NAND gates 102, 104, 106, 108, the fifth D flip-flop 110, the sixth D flip-flop 112, and the seventh D flip-flop 114 is equivalent to feeding the first exclusive OR gate 92 with the third and the fourth data outputs Q2, Q3, and feeding the output of the first exclusive OR gate 92 to the first data input D0. However, the propagation delay through the linear feedback circuitry 98 is about equal to the sum of the propagation delays through one of the first, the second, the third, and the fourth NAND gates 102, 104, 106, 108 and through one of the fifth D flip-flop 110, the sixth D flip-flop 112, and the seventh D flip-flop 114. Therefore, by using pipelining, propagation delays may be reduced significantly. Alternate embodiments of the linear feedback circuitry 98 may be used with shift registers having more or fewer than 4-bits and may have alternate pipelining architectures.

Figure 19:
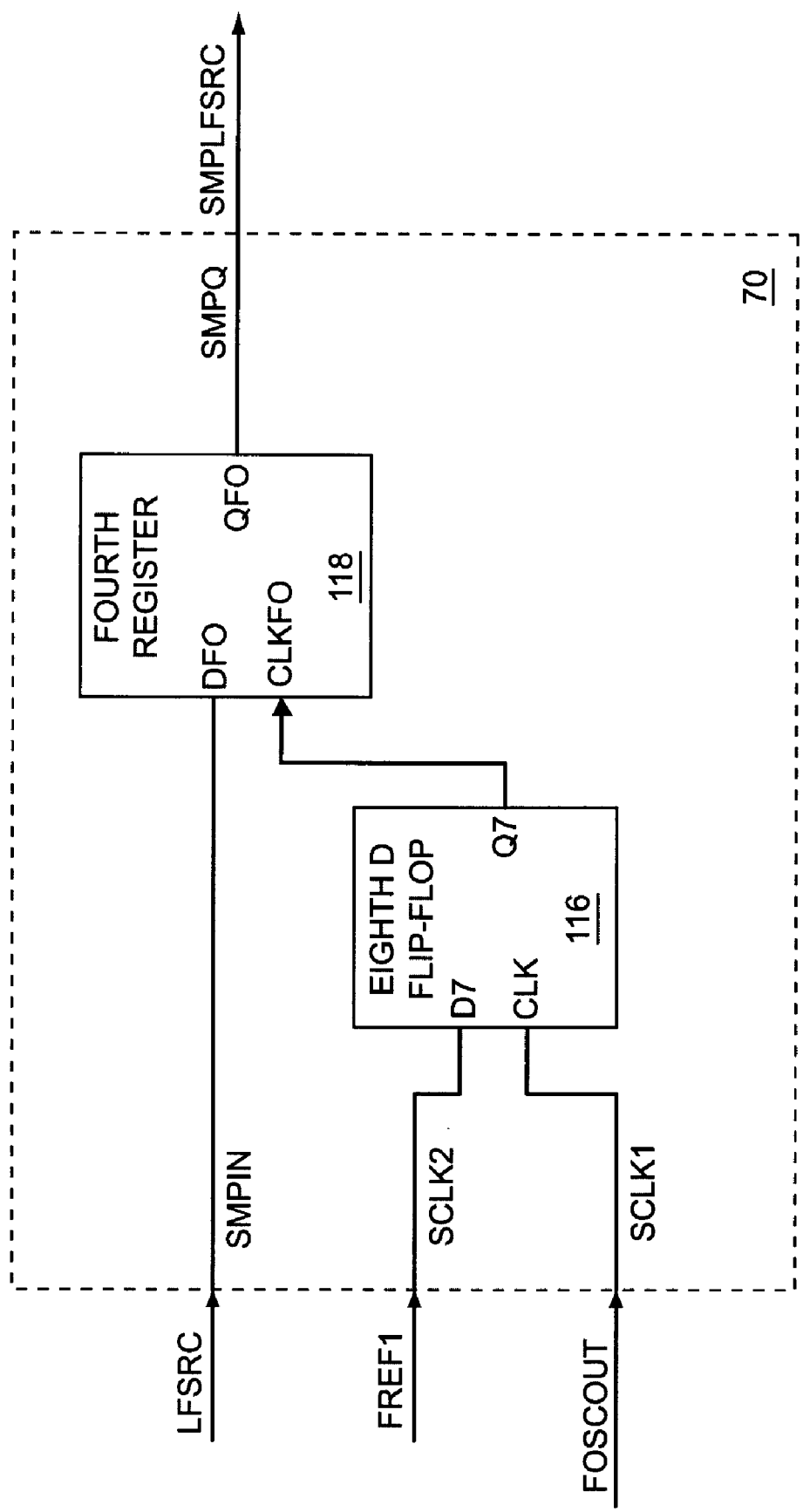
FIG. 19 shows details of a sampler illustrated in FIG. 11.

FIG. 19 shows details of the sampler 70 illustrated in FIG. 11. The sampler 70 includes an eighth D flip-flop 116 having an eighth data input D7, an eighth data output Q7, and a clock input CLK, and a fourth register 118 having a fourth data input DFO, a fourth data output QFO, and a fourth clock input CLKFO. The first sampler clock input SCLK1 is coupled to the clock input CLK of the eighth D flip-flop 116 and the second sampler clock input SCLK2 is coupled to the eighth data input D7. The eighth data output Q7 is coupled to the fourth clock input CLKFO. The sampler input SMPIN is coupled to the fourth data input DFO of the fourth register 118 and the sampler output SMPQ is coupled to the fourth data output QFO of the fourth register 118. Since the LFSR count LFSRC is synchronized with the first oscillator output signal FOSCOUT, the fourth register 118 should be clocked synchronously with the first oscillator output signal FOSCOUT. Since the eighth D flip-flop 116 is clocked using the first oscillator output signal FOSCOUT, and since the fourth register 118 is clocked using the output of the eighth D flip-flop 116, the fourth register 118 is clocked synchronously with the first oscillator output signal FOSCOUT.

In a first exemplary embodiment of the present invention, the LFSR 68 includes six D flip-flops coupled in series. In a second exemplary embodiment of the present invention, the frequency of the first oscillator output signal FOSCOUT is greater than or equal to about two gigahertz. In a third exemplary embodiment of the present invention, the frequency of the first oscillator output signal FOSCOUT is greater than or equal to about three gigahertz. In a fourth exemplary embodiment of the present invention, the frequency of the first oscillator output signal FOSCOUT is greater than or equal to about four gigahertz. In a fifth exemplary embodiment of the present invention, the frequency of the first frequency reference signal FREF1 is equal to about 50 megahertz.

Figure 20:
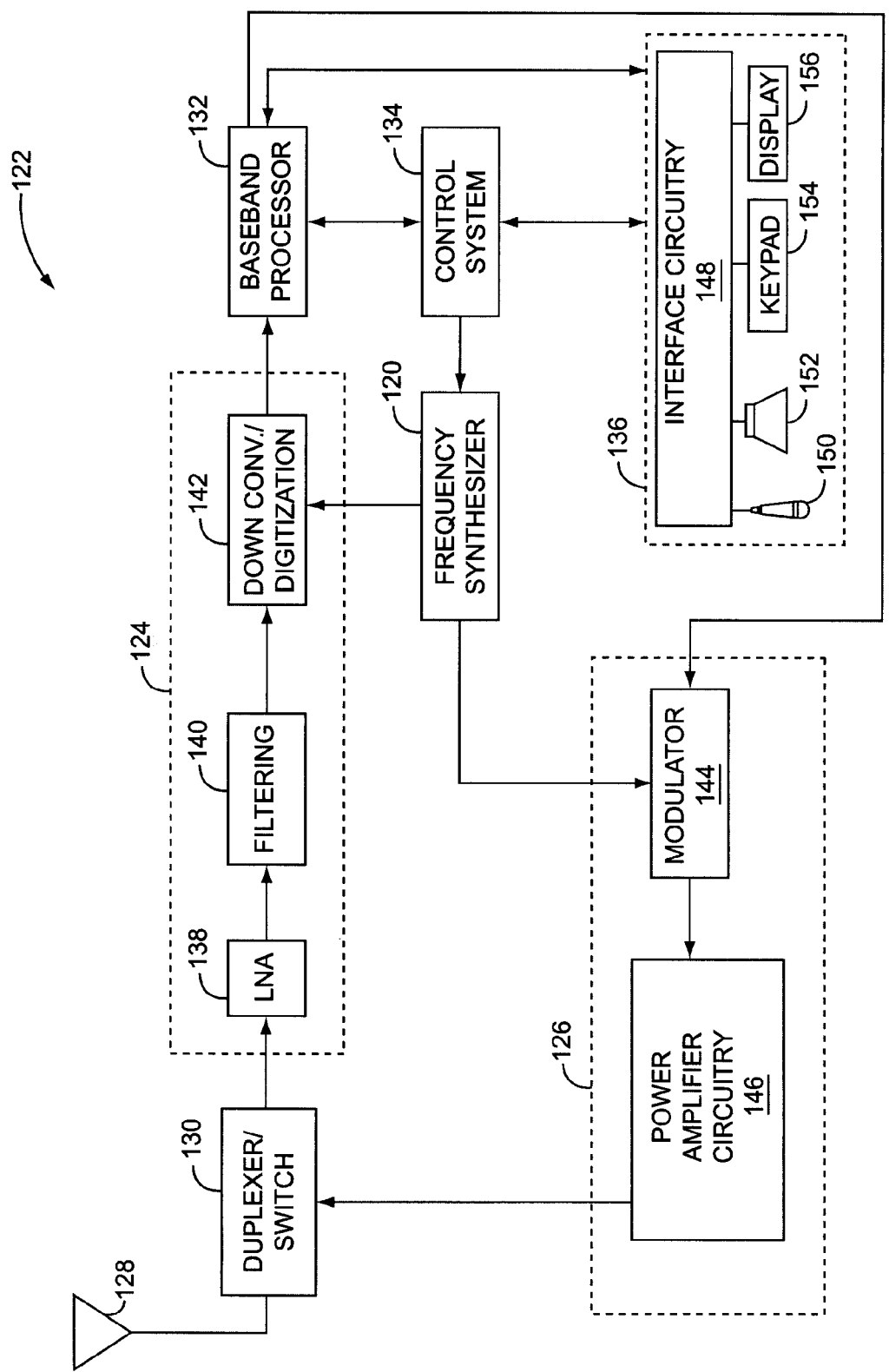
FIG. 20 shows an application example of the present invention used in a mobile terminal.

An application example of a FPLL synthesizer 10 is its use in a frequency synthesizer 120 in a mobile terminal 122. The basic architecture of the mobile terminal 122 is represented in FIG. 20 and may include a receiver front end 124, a radio frequency transmitter section 126, an antenna 128, a duplexer or switch 130, a baseband processor 132, a control system 134, the frequency synthesizer 120, and an interface 136. The receiver front end 124 receives information bearing radio frequency signals from one or more remote transmitters provided by a base station (not shown). A low noise amplifier (LNA) 138 amplifies the signal. A filter circuit 140 minimizes broadband interference in the received signal, while down conversion and digitization circuitry 142 down converts the filtered, received signal to an intermediate or baseband frequency signal, which is then digitized into one or more digital streams. The receiver front end 124 typically uses one or more mixing frequencies generated by the frequency synthesizer 120. The baseband processor 132 processes the digitized received signal to extract the information or data bits conveyed in the received signal. This processing typically comprises demodulation, decoding, and error correction operations. As such, the baseband processor 132 is generally implemented in one or more digital signal processors (DSPs).

On the transmit side, the baseband processor 132 receives digitized data, which may represent voice, data, or control information, from the control system 134, which it encodes for transmission. The encoded data is output to the transmitter 126, where it is used by a modulator 144 to modulate a carrier signal that is at a desired transmit frequency. Power amplifier circuitry 146 amplifies the modulated carrier signal to a level appropriate for transmission, and delivers the amplified and modulated carrier signal to the antenna 128 through the duplexer or switch 130.

A user may interact with the mobile terminal 122 via the interface 136, which may include interface circuitry 148 associated with a microphone 150, a speaker 152, a keypad 154, and a display 156. The interface circuitry 148 typically includes analog-to-digital converters, digital-to-analog converters, amplifiers, and the like. Additionally, it may include a voice encoder/decoder, in which case it may communicate directly with the baseband processor 132. The microphone 150 will typically convert audio input, such as the user's voice, into an electrical signal, which is then digitized and passed directly or indirectly to the baseband processor 132. Audio information encoded in the received signal is recovered by the baseband processor 132, and converted by the interface circuitry 148 into an analog signal suitable for driving the speaker 152. The keypad 154 and display 156 enable the user to interact with the mobile terminal 122, input numbers to be dialed, address book information, or the like, as well as monitor call progress information.

Figure 21:
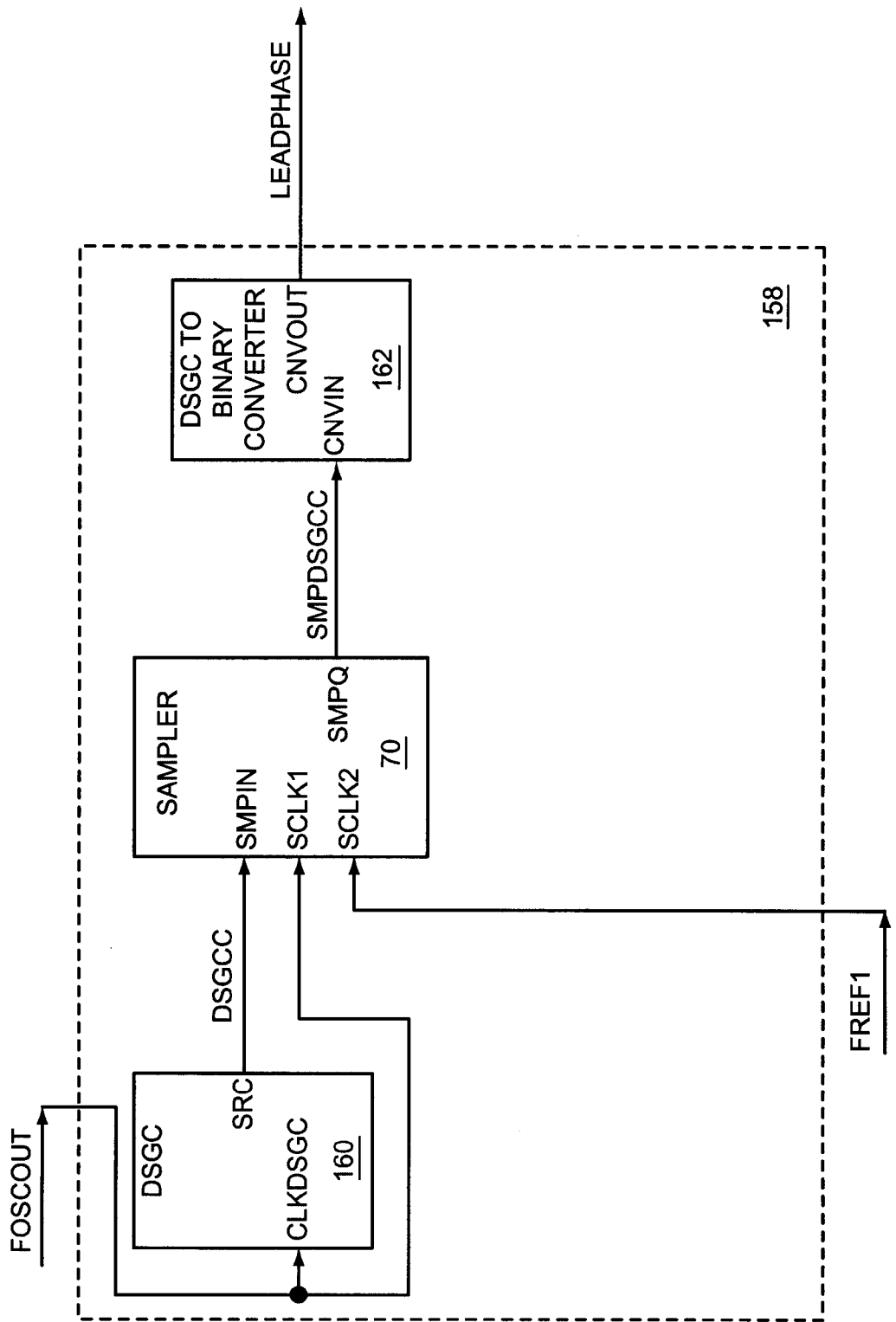
FIG. 21 shows a high resolution phase measurement circuit, according to one embodiment of the present invention.

FIG. 21 shows a high resolution phase measurement circuit 158, according to one embodiment of the present invention. The high resolution phase measurement circuit 158 may be used in place of the LFSR 68, the sampler 70, and the LFSR to binary converter 72 illustrated in FIG. 11. Specifically, a digital sequence generating circuit (DSGC) 160 may be used in place of the LFSR 68 and a DSGC to binary converter 162 may be used in place of the LFSR to binary converter 72. Therefore, the DSGC 160 may directly measure the frequency of the first oscillator output signal FOSCOUT. In one embodiment of the present invention, the high resolution phase measurement circuit 158 functions as a stand-alone phase measurement circuit, whereas in an alternate embodiment of the present invention, the high resolution phase measurement circuit 158 is integrated with other circuitry, such as frequency synthesis circuitry.

The high resolution phase measurement circuit 158 includes the DSGC 160, the sampler 70, and the DSGC to binary converter 162. Phase may be measured by counting the number of cycles of the first oscillator output signal FOSCOUT. The first oscillator output signal FOSCOUT feeds the first sampler clock input SCLK1 of the sampler 70 and a DSGC clock input CLKDSGC of the DSGC 160, which counts cycles of the first oscillator output signal FOSCOUT and provides an ongoing DSGC count DSGCC from a DSGC count output SRC of the DSGC 160 to the sampler input SMPIN of the sampler 70. The first frequency reference signal FREF1 feeds the second sampler clock input SCLK2 of the sampler 70. Since the ongoing DSGC count DSGCC advances based on the first oscillator output signal FOSCOUT, the sampler 70 samples the ongoing DSGC count DSGCC using a clock that has been synchronized to the first oscillator output signal FOSCOUT to prevent input errors. The sampler 70 provides a sampled DSGC count SMPDSGCC from the sampler output SMPQ of the sampler 70 to a converter input CNVIN of the DSGC to binary converter 162. The sampled DSGC count SMPDSGCC is based on sampling a value of the ongoing DSGC count DSGCC using the first frequency reference signal FREF1. The DSGC to binary converter 162 converts the sampled DSGC count SMPDSGCC into a corresponding binary count, which is provided from a converter output CNVOUT as the leading count signal LEADPHASE.

The count capacity of the DSGC 160 may be based on the ratio of the frequency of the first oscillator output signal FOSCOUT divided by the frequency of the first frequency reference signal FREF1. To prevent aliasing, the count capacity must be large enough to prevent duplication of any DSGC count codes during one cycle of the first frequency reference signal FREF1. If the count capacity is large, simplification techniques may be used to provide needed capacity, while maximizing the allowable frequency of the first oscillator output signal FOSCOUT, minimizing the size of look-up tables, minimizing circuit complexity, or any combination thereof.

Figure 22:
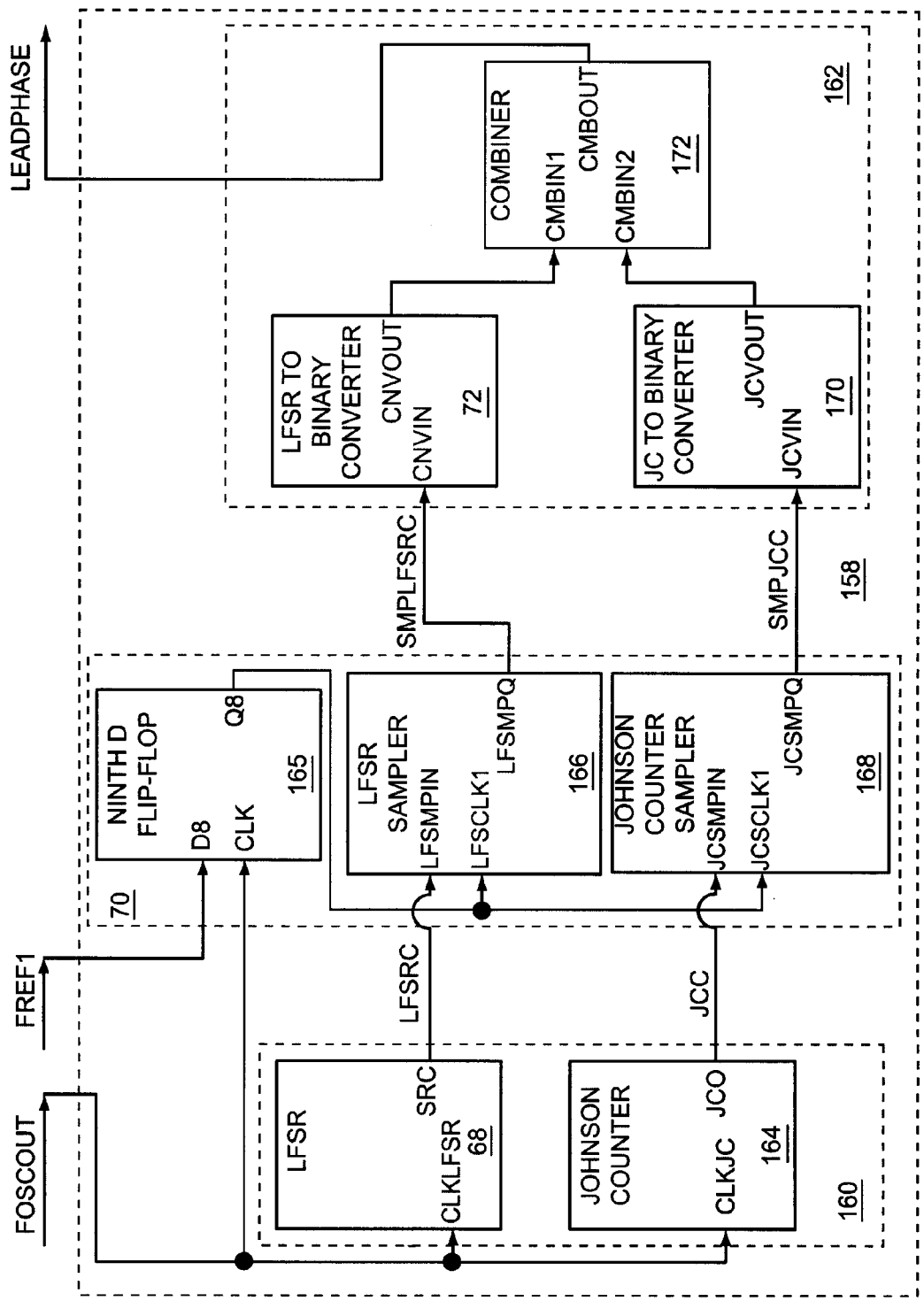
FIG. 22 shows details of the high resolution phase measurement circuit illustrated in FIG. 21, according to one embodiment of the high resolution phase measurement circuit.

FIG. 22 shows details of the high resolution phase measurement circuit 158 illustrated in FIG. 21, according to one embodiment of the high resolution phase measurement circuit 158. The DSGC 160 includes the LFSR 68 and a Johnson counter 164 to provide increased count capacity of the DSGC 160. The sampler 70 includes a ninth D flip-flop 165, an LFSR sampler 166 and a Johnson counter sampler 168. The DSGC to binary converter 162 includes the LFSR to binary converter 72, a Johnson counter to binary converter 170, and a combiner 172.

The first oscillator output signal FOSCOUT feeds a clock input CLK of the ninth D flip-flop 165, the LFSR clock input CLKLFSR of the LFSR 68, and a Johnson counter clock input CLKJC of the Johnson counter 164. The first frequency reference signal FREF1 feeds a ninth data input D8 of the ninth D flip-flop 165 and a ninth data output Q8 of the ninth D flip-flop 165 feeds a first LFSR sampler clock input LFSCLK1 of the LFSR sampler 166 and a first Johnson counter sampler clock input JCSCLK1 of the Johnson counter sampler 168. The LFSR 68 counts cycles of the first oscillator output signal FOSCOUT and provides the ongoing LFSR count LFSRC from the LFSR count output SRC of the LFSR 68 to an LFSR sampler input LFSMPIN of the LFSR sampler 166. The Johnson counter 164 counts cycles of the first oscillator output signal FOSCOUT and provides an ongoing Johnson counter count JCC from a Johnson counter output JCO of the Johnson counter 164 to a Johnson counter sampler input JCSMPIN of the Johnson counter sampler 168.

Since the ongoing LFSR count LFSRC and the ongoing Johnson counter count JCC advance based on the first oscillator output signal FOSCOUT, the ninth D flip-flop 165 provides a clock signal to the LFSR sampler 166 and the Johnson counter sampler 168 that is based on synchronizing the first frequency reference signal FREF1 to the first oscillator output signal FOSCOUT to prevent input errors. The LFSR sampler 166 provides the sampled LFSR count SMPLFSRC from an LFSR sampler output LFSMPQ of the LFSR sampler 166 to the converter input CNVIN of the LFSR to binary converter 72. The sampled LFSR count SMPLFSRC is based on sampling a value of the ongoing LFSR count LFSRC using the synchronized first frequency reference signal FREF1. The LFSR to binary converter 72 converts the sampled LFSR count SMPLFSRC into a corresponding LFSR binary count, which is provided from the converter output CNVOUT to a first combiner input CMBIN1 of the combiner 172.

Similarly, the Johnson counter sampler 168 provides a sampled Johnson counter count SMPJCC from a Johnson counter sampler output JCSMPQ of the Johnson counter sampler 168 to a Johnson counter converter input JCVIN of the Johnson counter to binary converter 170. The sampled Johnson counter count SMPJCC is based on sampling a value of the ongoing Johnson counter count JCC using the synchronized first frequency reference signal FREF1. The Johnson counter to binary converter 170 converts the sampled Johnson counter count SMPJCC into a corresponding Johnson counter binary count, which is provided from a Johnson counter converter output JCVOUT to a second combiner input CMBIN2 of the combiner 172. The combiner 172 combines the LFSR binary count and the Johnson counter binary count into a larger capacity binary count, which is provided as the leading count signal LEADPHASE. In other embodiments of the present invention, all or part of the LFSR binary count, all or part of the Johnson counter binary count, a difference between all or part of the LFSR binary count and all or part of the Johnson counter binary count, or any combination thereof, may be combined into a larger capacity binary count.

The high resolution phase measurement circuit 158 illustrated in FIG. 21 may include the LFSR 68 (FIG. 11), the LFSR to binary converter 72 (FIG. 11), or both, according to an alternate embodiment of the high resolution phase measurement circuit 158. The LFSR 68 may form the DSGC 160 (FIG. 21), the LFSR to binary converter 72 may form the DSGC to binary converter 162 (FIG. 21), or both.

Figure 23:
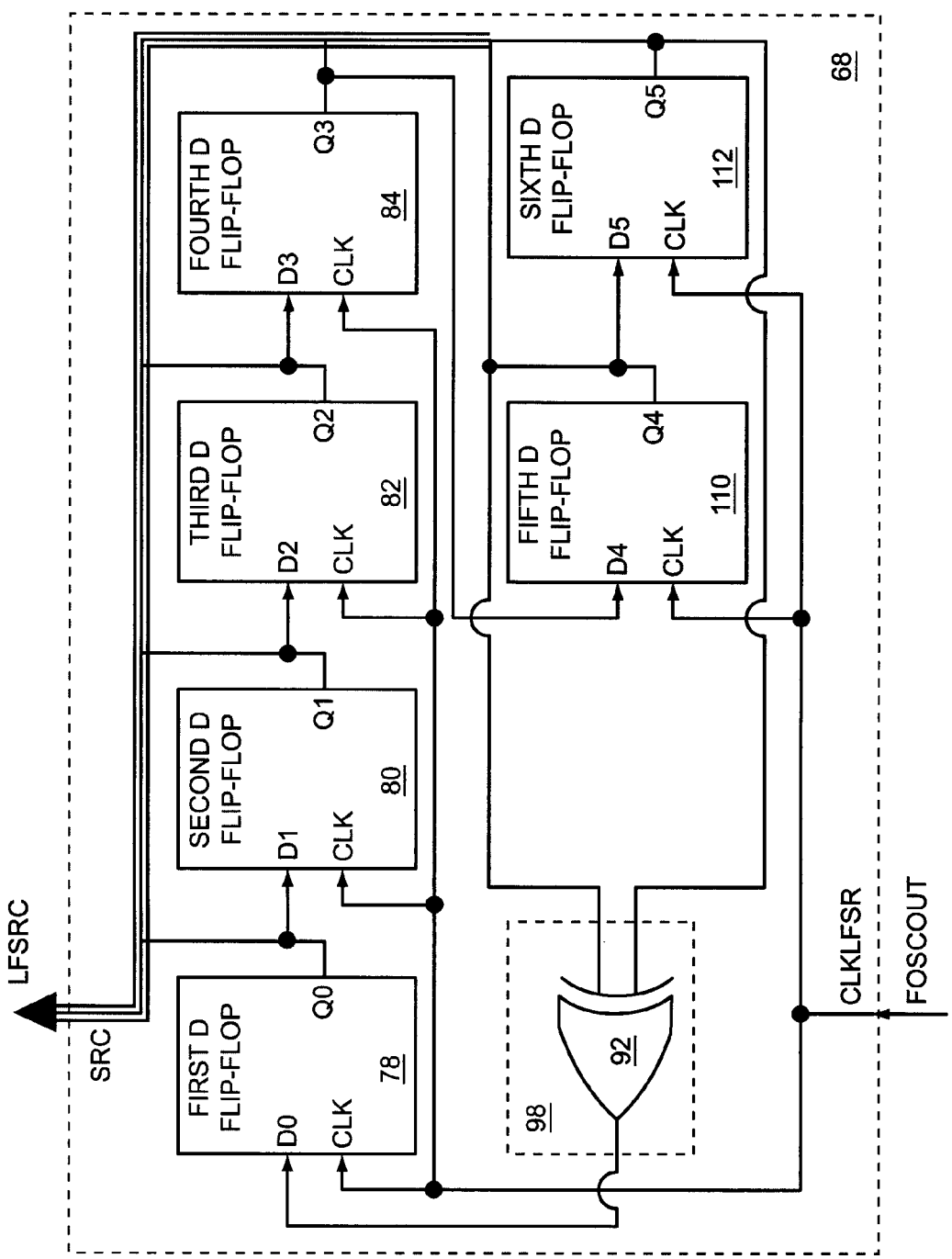
FIG. 23 shows details of the LFSR illustrated in FIGS. 11 and 22, according to one embodiment of the LFSR.

FIG. 23 shows details of the LFSR 68 illustrated in FIGS. 11 and 22, according to one embodiment of the LFSR 68. The LFSR 68 illustrated in FIG. 23 is similar to the LFSR 68 illustrated in FIG. 16, except while the LFSR 68 illustrated in FIG. 16 includes four flip-flops, the LFSR 68 illustrated in FIG. 23 includes six flip-flops for increased count capacity. Specifically, the LFSR 68 illustrated in FIG. 23 includes the first D flip-flop 78, the second D flip-flop 80, the third D flip-flop 82, the fourth D flip-flop 84, the fifth D flip-flop 110, the sixth D flip-flop 112, and the linear feedback circuitry 98. The LFSR clock input CLKLFSR is coupled to the clock input CLK of each of the first, second, third, fourth, fifth, and sixth D flip-flops 78, 80, 82, 84, 110, 112. The first, second, third, fourth, fifth, and sixth data outputs Q0, Q1, Q2, Q3, Q4, Q5 are coupled to the LFSR count output SRC to provide the ongoing LFSR count LFSRC, which is a 6-bit count. The first data output Q0 feeds the second data input D1, the second data output Q1 feeds the third data input D2, the third data output Q2 feeds the fourth data input D3, the fourth data output Q3 feeds the fifth data input D4, and the fifth data output Q4 feeds the sixth data input D5 to form a shift register. Therefore, at each cycle of the first oscillator output signal FOSCOUT, the first D flip-flop 78 clocks in the feedback from the linear feedback circuitry 98, the second D flip-flop 80 clocks in the data from the first D flip-flop 78, the third D flip-flop 82 clocks in the data from the second D flip-flop 80, the fourth D flip-flop 84 clocks in the data from the third D flip-flop 82, the fifth D flip-flop 110 clocks in the data from the fourth D flip-flop 84, and the sixth D flip-flop 112 clocks in the data from the fifth D flip-flop 110.

The linear feedback circuitry 98 includes the first exclusive OR gate 92, which is fed from the fifth and sixth data outputs Q4, Q5. The output of the first exclusive OR gate 92 feeds the first data input D0. The first, second, third, fourth, fifth, and sixth D flip-flops 78, 80, 82, 84, 110, 112 form a shift register and the first exclusive OR gate 92 provides linear feedback to provide a system that sequences through 63 different combinations of the first, second, third, fourth, fifth, and sixth data outputs Q0, Q1, Q2, Q3, Q4, Q5.

Figure 24:
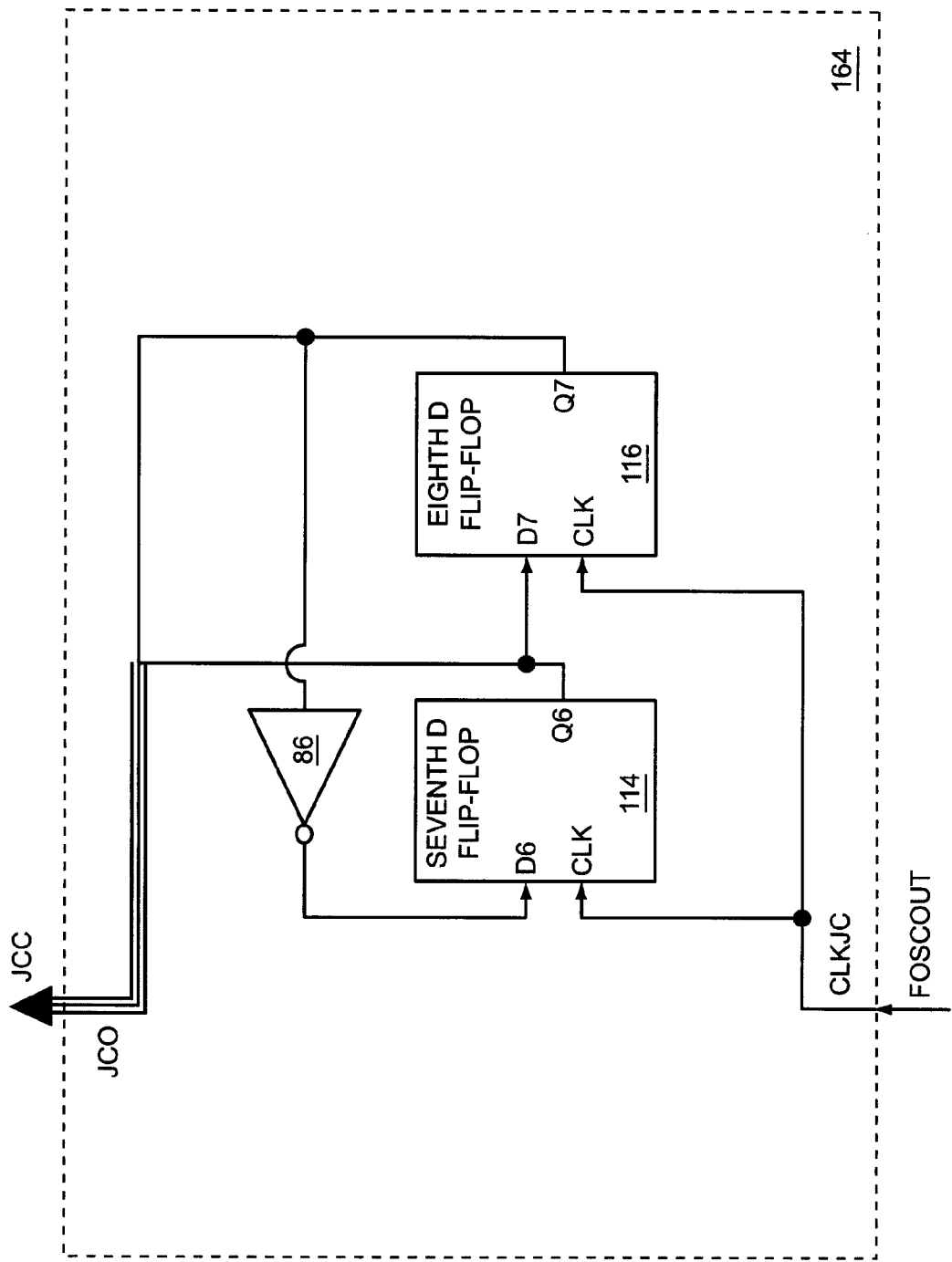
FIG. 24 shows details of a Johnson counter illustrated in FIG. 22, according to one embodiment of the Johnson counter.

FIG. 24 shows details of the Johnson counter 164 illustrated in FIG. 22, according to one embodiment of the Johnson counter 164, which includes the seventh D flip-flop 114, the eighth D flip-flop 116, and the inverter 86. The Johnson counter clock input CLKJC is coupled to the clock input CLK of each of the seventh and eighth D flip-flops 114, 116. The seventh and eighth data outputs Q6, Q7, of the seventh and eighth D flip-flops 114, 116, respectively, are coupled to the Johnson counter output JCO to provide the ongoing Johnson counter count JCC, which is a 2-bit count. The seventh data output Q6 feeds the eighth data input D7 and the eighth data output Q7 feeds the inverter 86, which feeds the seventh data input D6. If the ongoing Johnson counter count JCC is expressed as Q7 Q6, then the count would progress as 00, 01, 11, 10 and then repeat. Therefore the Johnson counter 164 illustrated in FIG. 24 is a modulo 4 counter.

In one embodiment of the present invention, the high resolution phase measurement circuit 158 illustrated in FIG. 22 includes the LFSR 68 illustrated in FIG. 23 and the Johnson counter 164 illustrated in FIG. 24. The combiner 172 combines the binary signal from the LFSR to binary converter 72, which is a modulo 63 signal, with the binary signal from the Johnson counter to binary converter 170, which is a modulo 4 signal, to create a modulo 252 signal, which is provided as the leading count signal LEADPHASE, which may be provided as follows, in an exemplary embodiment of the present invention. The leading count signal LEADPHASE is an 8-bit signal represented as Q7 Q6 Q5 Q4 Q3 Q2 Q1 Q0. The binary signal from the Johnson counter to binary converter 170 is represented as JCQ7 JCQ6. The binary signal from the LFSR to binary converter 72 is represented as SRQ5 SRQ4 SRQ3 SRQ2 SRQ1 SRQ0, such that Q0=SRQ0, Q1=SRQ1, Q2=SRQ2, Q3=SRQ3, Q4=SRQ4, and (Q7 Q6)=(SRQ1 SRQ0)−(JCQ7 JCQ6). An example of a counting sequence of the leading count signal LEADPHASE is presented in Table 2 below.

The two rightmost columns of Table 2 include Q5 Q4 Q3 Q2 Q1 Q0 of the leading count signal LEADPHASE, which are the six least significant digits of the leading count signal LEADPHASE. Q5 Q4 Q3 Q2 Q1 Q0 are directly provided by SRQ5 SRQ4 SRQ3 SRQ2 SRQ1 SRQ0 of the LFSR to binary converter 72. Since the LFSR 68 illustrated in FIG. 23 is a modulo 63 counter, Q5 Q4 Q3 Q2 Q1 Q0 start with a count of 0 0 0 0 0 0 and progress up to a count of 1 1 1 1 1 0 before rolling over to a count of 0 0 0 0 0 0. Expressed in decimal, Q5 Q4 Q3 Q2 Q1 Q0 start with a count of 0 and progress up to a count of 62 before rolling over to a count of 0.

Since JCQ7 JCQ6 are provided by the Johnson counter to binary converter 170, and since the Johnson counter 164 (FIG. 22) is a modulo 4 counter, JCQ7 JCQ6 may start with a count of 0 0 and progress up to a count of 1 1 before rolling over to a count of 0 0. Similarly, SRQ1 SRQ0 of the LFSR to binary converter 72 may start with a count of 0 0 and progress up to a count of 1 1 before rolling over to a count of 0 0, except when SRQ5 SRQ4 SRQ3 SRQ2 SRQ1 SRQ0 of the LFSR to binary converter 72 progresses to a count of 1 1 1 1 1 0 and then rolls over to 0 0 0 0 0 0, wherein SRQ1 SRQ0 progresses to 1 0 before rolling over to 0 0. Since both JCQ7 JCQ6 and SRQ1 SRQ0 are representative of each successive cycle of the first oscillator output signal FOSCOUT, they remain synchronized with one another until SRQ1 SRQ0 rolls over to 0 0 at 1 0 instead of at 1 1.

For example, if SRQ1 SRQ0 starts out at 0 0 and JCQ7 JCQ6 starts out at 0 1, the next count progression would be SRQ1 SRQ0=0 1 and JCQ7 JCQ6=1 0, then the next count progression would be SRQ1 SRQ0=1 0 and JCQ7 JCQ6=1 1, then the next count progression would be SRQ1 SRQ0=1 1 and JCQ7 JCQ6=0 0, followed by the next count progression, which would be SRQ1 SRQ0=0 0 and JCQ7 JCQ6=0 1. A useful characteristic is that for all four of the above count progressions, a difference between JCQ7 JCQ6 and SRQ1 SRQ0 produces the same value. Specifically, when SRQ1 SRQ0=0 0 and JCQ7 JCQ6=0 1, then (SRQ1 SRQ0)−(JCQ7 JCQ6)=1 1 (ignoring the bit that was borrowed to make the subtraction); when SRQ1 SRQ0=0 1 and JCQ7 JCQ6=1 0, then (SRQ1 SRQ0)−(JCQ7 JCQ6)=1 1 (ignoring the bit that was borrowed to make the subtraction); when SRQ1 SRQ0=1 0 and JCQ7 JCQ6=1 1, then (SRQ1 SRQ0)−(JCQ7 JCQ6)=1 1 (ignoring the bit that was borrowed to make the subtraction); and when SRQ1 SRQ0=1 1 and JCQ7 JCQ6=0 0, then (SRQ1 SRQ0)−(JCQ7 JCQ6)=1 1. The count progression repeats in lock step until Q5 Q4 Q3 Q2 Q1 Q0 progresses up to a count of 1 1 1 1 1 0, wherein SRQ1 SRQ0 rolls over to 0 0 at 1 0 instead of at 1 1, and SRQ1 SRQ0 slips a count with respect to JCQ7 JCQ6.

Specifically, when the relationship between SRQ1 SRQ0 and JCQ7 JCQ6 is such that JCQ7 JCQ6=1 1 when SRQ1 SRQ0=1 0, then normally SRQ1 SRQ0 would progress next to 1 1 and JCQ7 JCQ6 would progress to 0 0; however, when SRQ1 SRQ0 progresses to 0 0 instead of to 1 1, which happens during a rollover, then SRQ1 SRQ0 slips a count with respect to JCQ7 JCQ6, such that JCQ7 JCQ6=0 0 when SRQ1 SRQ0=0 0. Therefore, after the count slip, JCQ7 JCQ6=0 1 when SRQ1 SRQ0=0 1, JCQ7 JCQ6=1 0 when SRQ1 SRQ0=1 0, JCQ7 JCQ6=1 1 when SRQ1 SRQ0=1 1, and (SRQ1 SRQ0)−(JCQ7 JCQ6)=0 0 for all values of Q5 Q4 Q3 Q2 Q1 Q0 until another rollover occurs. The progression of (SRQ1 SRQ0)−(JCQ7 JCQ6) may start at 0 0, then advance to 0 1 at the first rollover, followed by an advance to 1 0 at the next rollover, which may be followed by an advance to 1 1 at the next rollover, then followed by a (SRQ1 SRQ0)−(JCQ7 JCQ6) rollover to 0 0 at the next rollover, and so on. Therefore, (SRQ1 SRQ0)−(JCQ7 JCQ6) may be used as the two most significant bits of the leading count signal LEADPHASE.

The middle column of Table 2 includes Q7 Q6 of the leading count signal LEADPHASE, which are the two most significant digits of the leading count signal LEADPHASE and are based on (SRQ1 SRQ0)−(JCQ7 JCQ6). The leftmost column of Table 2 includes SRQ1 SRQ0 and the column to the right of the leftmost column includes JCQ7 JCQ6. The middle column of Table 2=Q7 Q6=(SRQ1 SRQ0)−(JCQ7 JCQ6). Counts between Q5 Q4 Q3 Q2 Q1 Q0=0 0 0 1 0 0 and Q5 Q4 Q3 Q2 Q1 Q0=1 1 1 1 1 0 are not included in Table 2 for conciseness.

TABLE 2

| SRQ1 | SRQ0 | JCQ7 | JCQ6 | Q7 | Q6 | Q5 | Q4 | Q3 | Q2 | Q1 | Q0 |
|---|---|---|---|---|---|---|---|---|---|---|---|
| 0 | 0 | 0 | 0 | 0 | 0 | 0 | 0 | 0 | 0 | 0 | 0 |
| 0 | 1 | 0 | 1 | 0 | 0 | 0 | 0 | 0 | 0 | 0 | 1 |
| 1 | 0 | 1 | 0 | 0 | 0 | 0 | 0 | 0 | 0 | 1 | 0 |
| 1 | 1 | 1 | 1 | 0 | 0 | 0 | 0 | 0 | 0 | 1 | 1 |
| 0 | 0 | 0 | 0 | 0 | 0 | 0 | 0 | 0 | 1 | 0 | 0 |
| | | COUNTS | | NOT | | SHOWN | | | | | |
| 1 | 0 | 1 | 0 | 0 | 0 | 1 | 1 | 1 | 1 | 1 | 0 |
| 0 | 0 | 1 | 1 | 0 | 1 | 0 | 0 | 0 | 0 | 0 | 0 |
| 0 | 1 | 0 | 0 | 0 | 1 | 0 | 0 | 0 | 0 | 0 | 1 |
| 1 | 0 | 0 | 1 | 0 | 1 | 0 | 0 | 0 | 0 | 1 | 0 |
| 1 | 1 | 1 | 0 | 0 | 1 | 0 | 0 | 0 | 0 | 1 | 1 |
| 0 | 0 | 1 | 1 | 0 | 1 | 0 | 0 | 0 | 1 | 0 | 0 |
| | | COUNTS | | NOT | | SHOWN | | | | | |
| 1 | 0 | 0 | 1 | 1 | 0 | 1 | 1 | 1 | 1 | 1 | 0 |
| 0 | 0 | 1 | 0 | 1 | 0 | 0 | 0 | 0 | 0 | 0 | 0 |
| 0 | 1 | 1 | 1 | 1 | 0 | 0 | 0 | 0 | 0 | 0 | 1 |
| 1 | 0 | 0 | 0 | 1 | 0 | 0 | 0 | 0 | 0 | 1 | 0 |
| 1 | 1 | 0 | 1 | 1 | 0 | 0 | 0 | 0 | 0 | 1 | 1 |
| 0 | 0 | 1 | 0 | 1 | 0 | 0 | 0 | 0 | 1 | 0 | 0 |
| | | COUNTS | | NOT | | SHOWN | | | | | |
| 1 | 0 | 0 | 0 | 1 | 0 | 1 | 1 | 1 | 1 | 1 | 0 |
| 0 | 0 | 0 | 1 | 1 | 1 | 0 | 0 | 0 | 0 | 0 | 0 |
| 0 | 1 | 1 | 0 | 1 | 1 | 0 | 0 | 0 | 0 | 0 | 1 |
| 1 | 0 | 1 | 1 | 1 | 1 | 0 | 0 | 0 | 0 | 1 | 0 |
| 1 | 1 | 0 | 0 | 1 | 1 | 0 | 0 | 0 | 0 | 1 | 1 |
| 0 | 0 | 0 | 1 | 1 | 1 | 0 | 0 | 0 | 1 | 0 | 0 |
| | | COUNTS | | NOT | | SHOWN | | | | | |
| 1 | 0 | 1 | 1 | 1 | 1 | 1 | 1 | 1 | 1 | 1 | 0 |
| 0 | 0 | 0 | 0 | 0 | 0 | 0 | 0 | 0 | 0 | 0 | 0 |

Those skilled in the art will recognize improvements and modifications to the preferred embodiments of the present invention. All such improvements and modifications are considered within the scope of the concepts disclosed herein and the claims that follow.

What is claimed is:

1. A circuit comprising:
   a digital sequence generating circuit (DSGC) adapted to:
      receive a first signal having a first frequency;
      count each cycle of the first signal to generate an ongoing DSGC count; and
      provide a DSGC count signal based on the ongoing DSGC count;
   a DSGC count to binary count converter adapted to:
      convert the ongoing DSGC count to a binary count based on the DSGC count signal; and provide a first binary count signal based on the binary count;
a first register adapted to:
receive the first binary count signal and a first reference signal having a first reference frequency; and
provide a second binary count signal based on clocking in the first binary count signal using the first reference signal; and
first summing and difference circuitry adapted to receive the first binary count signal and the second binary count signal, and provide a measured frequency signal based on a difference between the first binary count signal and the second binary count signal,
wherein the measured frequency signal is indicative of the first frequency relative to the first reference frequency.

2. The circuit of claim 1 wherein the difference between the first binary count signal and the second binary count signal is indicative of a change in phase of the first signal during one cycle of the first reference signal.

3. The circuit of claim 1 further comprising a sampler adapted to:
receive the first signal;
receive the first reference signal;
receive the DSGC count signal;
synchronize the first reference signal using the first signal to provide a synchronized first reference signal; and
sample the DSGC count signal using the synchronized first reference signal to provide a sampled DSGC count signal,
wherein converting the ongoing DSGC count to the binary count is further based on the sampled DSGC count signal.

4. The circuit of claim 1 wherein the DSGC count to binary count converter comprises at least one look-up table associated with converting the ongoing DSGC count to the binary count.

5. The circuit of claim 1 wherein the DSGC is a linear feedback shift register (LFSR) comprising a plurality of shift registers coupled in series and adapted to provide the DSGC count signal.

6. The circuit of claim 5 wherein the LFSR comprises linear feedback circuitry adapted to receive output signals from at least two of the plurality of shift registers and provide a feedback signal to one of the plurality of shift registers.

7. The circuit of claim 6 wherein the linear feedback circuitry comprises pipelining circuitry to reduce propagation delay through the linear feedback circuitry.

8. The circuit of claim 7 wherein the pipelining circuitry comprises at least one register.

9. The circuit of claim 6 wherein the linear feedback circuitry comprises at least one exclusive OR gate.

10. The circuit of claim 5 wherein the plurality of shift registers consists of six shift registers.

11. The circuit of claim 1 wherein the first frequency is greater than or equal to about two gigahertz.

12. The circuit of claim 1 wherein the first frequency is greater than or equal to about three gigahertz.

13. The circuit of claim 1 wherein the first frequency is greater than or equal to about four gigahertz.

14. The circuit of claim 1 wherein the first reference frequency is equal to about fifty megahertz.

15. The circuit of claim 1 wherein the first frequency is greater than the first reference frequency.

16. The circuit of claim 1 wherein the DSGC, the DSGC count to binary count converter, the first register, and the first summing and difference circuitry form a frequency measurement circuit, which is used to form a first frequency-locked loop (FLL).

17. The circuit of claim 16 wherein during a first FLL operating mode, the first FLL is adapted to coarse tune the first frequency of the first signal based on the measured frequency signal.

18. The circuit of claim 17 wherein the first FLL comprises discrete tuning elements and during the first FLL operating mode is further adapted to select at least one of the discrete tuning elements based on the measured frequency signal, and the first frequency is based on at least one selected discrete tuning element.

19. The circuit of claim 17 wherein during the first FLL operating mode, the first FLL is adapted to provide a first control signal, such that the coarse tuning of the first frequency of the first signal is further based on the first control signal.

20. The circuit of claim 19 further comprising a first variable frequency oscillator adapted to, during the first FLL operating mode, provide the first signal having the first frequency, which is based on the first control signal.

21. The circuit of claim 17 wherein the frequency measurement circuit is used to form a first frequency detector circuit, which during the first FLL operating mode is adapted to provide a first frequency error signal based on a difference between the measured frequency signal and a desired frequency value.

22. The circuit of claim 21 wherein the first FLL comprises a first loop filter circuit, which during the first FLL operating mode is adapted to receive and filter the first frequency error signal to provide a first control signal.

23. The circuit of claim 17 further comprising a first phase-locked loop (PLL) wherein during a first PLL operating mode, the first PLL is adapted to fine tune the first frequency of the first signal based on a phase difference between the first signal and a second reference signal.

24. The circuit of claim 23 wherein the second reference signal is approximately identical to the first reference signal.

25. The circuit of claim 1 wherein the DSGC comprises:
a linear feedback shift register (LFSR) adapted to:
receive the first signal having the first frequency;
count each cycle of the first signal to generate an ongoing LFSR count; and
provide an LFSR count signal based on the ongoing LFSR count; and
a Johnson counter adapted to:
receive the first signal having the first frequency;
count each cycle of the first signal to generate an ongoing Johnson counter count; and
provide a Johnson counter count signal based on the ongoing Johnson counter count,
wherein the DSGC count signal comprises the LFSR count signal and the Johnson counter count signal.

26. The circuit of claim 25 wherein the DSGC count to binary count converter comprises:
an LFSR to binary converter adapted to convert the ongoing LFSR count to an LFSR binary count based on the LFSR count signal;
a Johnson counter adapted to convert the ongoing Johnson counter count to a Johnson counter binary count based on the Johnson counter count signal; and
a combiner adapted to combine the LFSR binary count and the Johnson counter binary count to provide the binary count.

27. The circuit of claim 26 wherein the binary count is further based on combining at least two of all of the LFSR binary count, part of the LFSR binary count, all of the Johnson counter binary count, part of the Johnson counter binary count, a difference between all of the LFSR binary count and all of the Johnson counter binary count, a difference between part of the LFSR binary count and all of the Johnson counter binary count, a difference between all of the LFSR binary count and part of the Johnson counter binary count, and a difference between part of the LFSR binary count and part of the Johnson counter binary count.

28. The circuit of claim 26 wherein the binary count is further based on combining part of the LFSR binary count and a difference between part of the LFSR binary count and all of the Johnson counter binary count.

29. A method comprising:
  providing a linear feedback shift register (DSGC);
  receiving a first signal having a first frequency;
  counting each cycle of the first signal to generate an ongoing DSGC count;
  providing a DSGC count signal based on the ongoing DSGC count;
  providing a DSGC count to binary count converter;
  converting the ongoing DSGC count to a binary count based on the DSGC count signal;
  providing a first binary count signal based on the binary count;
  receiving the first binary count signal and a first reference signal having a first reference frequency;
  providing a second binary count signal based on clocking in the first binary count signal using the first reference signal; and
  providing a measured frequency signal based on a difference between the first binary count signal and the second binary count signal,
  wherein the measured frequency signal is indicative of the first frequency relative to the first reference frequency.

* * * * *